(12) United States Patent
Nobuhara et al.

(10) Patent No.: US 8,162,547 B2
(45) Date of Patent: Apr. 24, 2012

(54) OPTICAL SUBASSEMBLY MANUFACTURING METHOD

(75) Inventors: Hiroyuki Nobuhara, Kawasaki (JP);
Tetsuya Miyatake, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 181 days.

(21) Appl. No.: 12/654,542

(22) Filed: Dec. 22, 2009

(65) Prior Publication Data
US 2010/0104290 A1    Apr. 29, 2010

Related U.S. Application Data

(63) Continuation of application No. PCT/JP2007/063016, filed on Jun. 28, 2007.

(51) Int. Cl.
*G02B 6/36* (2006.01)
*G02B 6/32* (2006.01)

(52) U.S. Cl. ......... 385/93; 385/33; 385/49; 385/52; 65/37; 438/27; 438/29; 257/98; 257/E33.068

(58) Field of Classification Search ............... 385/33, 385/49, 52, 93; 65/37; 438/22, 27, 29; 257/98, 257/E33.068
See application file for complete search history.

(56) References Cited

U.S. PATENT DOCUMENTS

| | | | | |
|---|---|---|---|---|
| 3,760,237 | A | * 9/1973 | Jaffe | .................. 257/98 |
| 4,625,333 | A | * 11/1986 | Takezawa et al. | ............ 398/139 |
| 5,548,677 | A | 8/1996 | Kakii et al. | |
| 5,991,101 | A | * 11/1999 | Holderer et al. | ............. 359/819 |
| 7,037,002 | B2 | * 5/2006 | Takehata et al. | ................. 385/93 |
| 7,204,649 | B2 | * 4/2007 | Tanaka | ............................ 385/93 |

FOREIGN PATENT DOCUMENTS

| | | |
|---|---|---|
| JP | 1-226189 | 9/1989 |
| JP | 3-141308 | 6/1991 |
| JP | 5-134137 | 5/1993 |
| JP | 7-209558 | 8/1995 |
| JP | 9-197158 | 7/1997 |
| JP | 11-345955 | 12/1999 |
| JP | 2005-338408 | 12/2005 |
| JP | 2005-340770 | 12/2005 |

OTHER PUBLICATIONS

International Search Report for PCT/JP2007/063016, mailed on Oct. 2, 2007. Japanese PCT International Preliminary Report on Patentability mailed Jan. 14, 2010 in corresponding International Patent Application PCT/JP2007/063016 (6 pages) including English translation of the International Preliminary Report mailed Feb. 4, 2010 (7 pages).
"Self-aligned Assembly for Optical devices Using AuSn Solder Bump Bonding," Junichi Sasaki et al., The Institute of Electronics, Information and Communication Engineers, vol. 93, Dec. 1993, pp. 61-66.

* cited by examiner

*Primary Examiner* — Daniel Petkovsek
(74) *Attorney, Agent, or Firm* — Staas & Halsey LLP

(57) ABSTRACT

An optical subassembly manufacturing method includes forming connecting electrodes and a piece of high-melting-point glass on a wiring substrate; positioning on and connecting to the connecting electrodes, an optoelectronic converting element; disposing on the piece of high-melting-point glass, a piece of low-melting-point glass having a melting point lower than the piece of high-melting-point glass; and fixing to the piece of low-melting-point glass, a protruding portion of a lens member further having a lens portion. The protruding portion has a shape matching that of the piece of high-melting-point glass, and relative positions of the protruding portion and the optical axis of the lens portion are determined to correspond to relative positions of the connecting electrodes and the piece of high-melting-point glass. The fixing includes fixing the protruding portion of the lens member to the piece of high-melting-point glass via surface tension generated by melting the piece of low-melting-point glass.

11 Claims, 16 Drawing Sheets

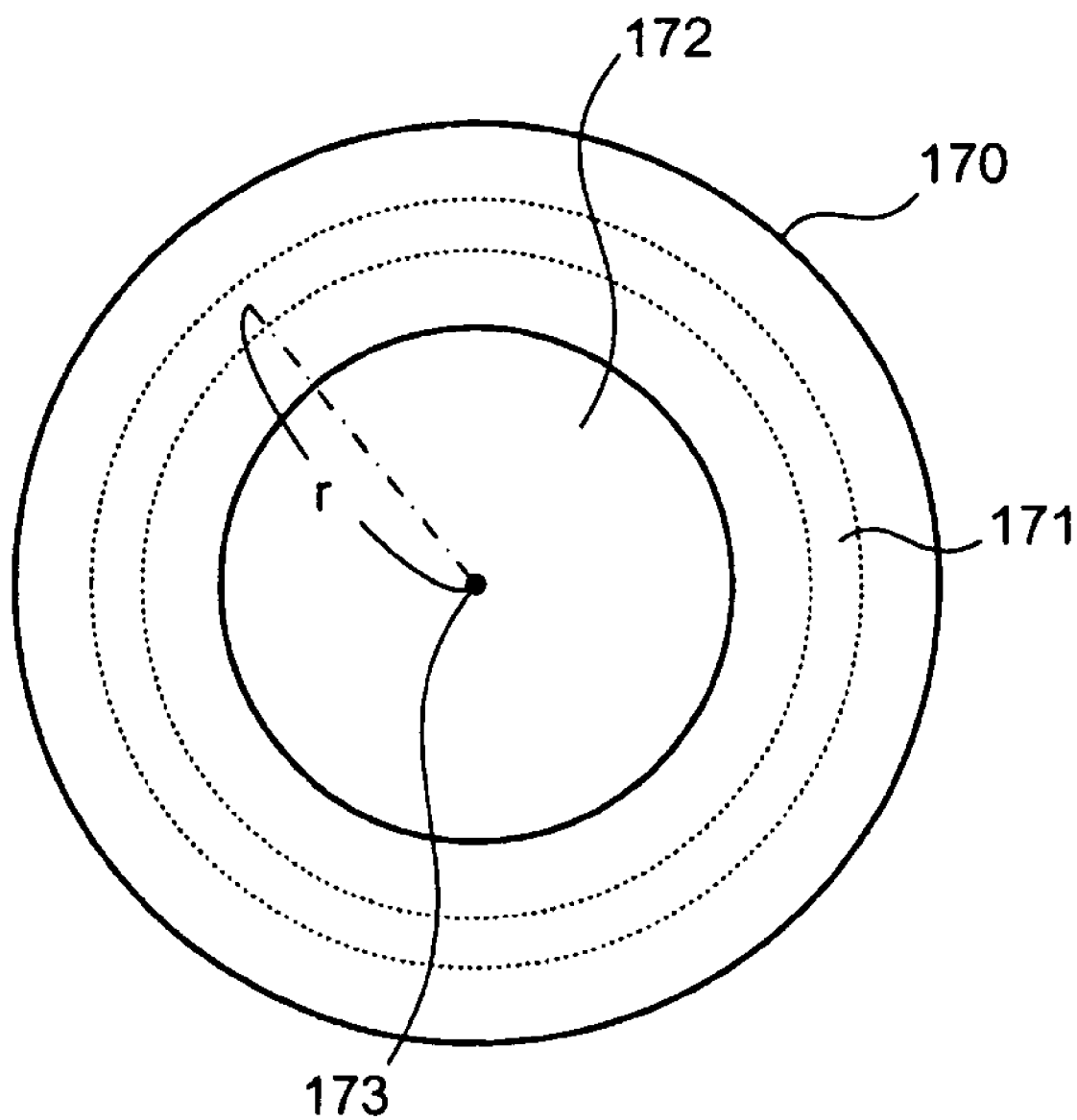

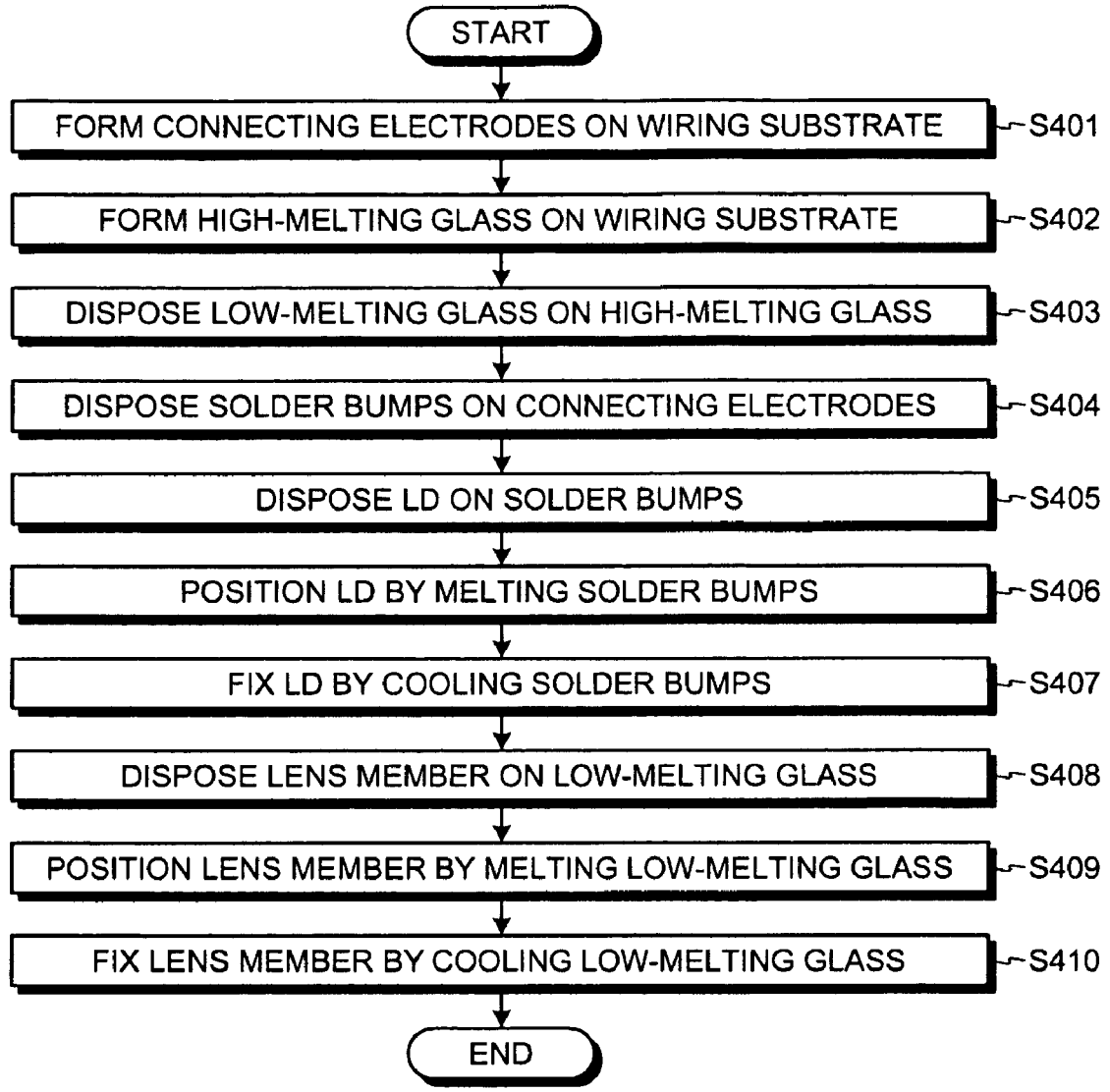
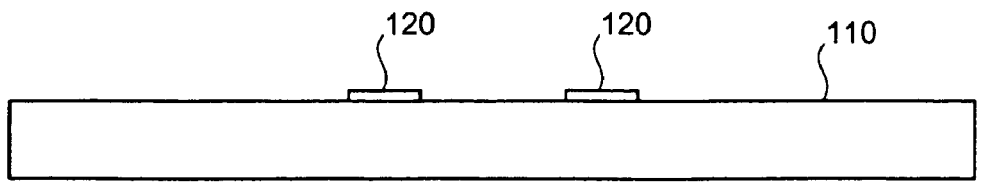

OPTICAL SUBASSEMBLY MANUFACTURING METHOD

CROSS-REFERENCE TO RELATED APPLICATIONS

This application is a U.S. Continuation Application filed under 35 U.S.C. §111(a) claiming priority benefit of International Application PCT/JP2007/063016, filed on Jun. 28, 2007, the disclosures of which are incorporated herein by reference.

FIELD

The embodiments discussed herein are related to an optical subassembly manufacturing method, an optical subassembly, an OSA array, an optical interconnecting device, a WDM oscillator, and a receiving circuit.

BACKGROUND

A transmitter optical subassembly (TOSA) that converts an electrical signal into an optical signal and a receiver optical subassembly (ROSA) that converts an optical signal into an electrical signal are used in optical interconnections that, using optical fibers, transmit data in parallel between chips, boards, or racks (see, e.g., Japanese Patent Application Laid-Open Publication Nos. 2005-338408, H11-345955, H9-197158, H7-209558, and H5-134137).

FIG. 26 is a perspective diagram of an optical interconnecting module. As depicted in FIG. 26, an optical interconnecting module 2610 is a module that connects multiple boards 2620 through optical fibers 2630. The optical interconnecting module 2610 includes an optical transmitting module 2640 and an optical receiving module 2650.

The optical transmitting module 2640 includes a transmitting circuit 2641 and an optical subassembly 2642. The transmitting circuit 2641 outputs to the optical subassembly 2642, an electrical signal that is based on a data signal transmitted from a circuit element of the board 2620. The optical subassembly 2642 includes a laser diode (LD) and is a TOSA that emits through an optical fiber 2630, an optical signal that is based on the electrical signal output from the transmitting circuit 2641.

The optical receiving module 2650 includes an optical subassembly 2651 and a receiving circuit 2652. The optical subassembly 2651 includes a photo detector (PD) and is a ROSA that outputs to the receiving circuit 2652, an electrical signal that is based on the optical signal received through the optical fiber 2630. The receiving circuit 2652 demodulates, into a data signal, the electrical signal output from the optical subassembly 2651 and outputs the demodulated data signal to a circuit element of a board 2620.

FIG. 27 is a front cross-sectional view of a conventional optical subassembly. As depicted in FIG. 27, the conventional optical subassembly 2700 includes a optoelectronic converting element 2720 such as an LD disposed on a wiring substrate 2710, and a metal cap 2730 that hermetically seals the optoelectronic converting element 2720. The wiring substrate 2710 is provided with a lead pin that connects the optoelectronic converting element thereto, etc. The metal cap 2730 is provided with a lens member 2740.

When the optoelectronic converting element 2720 is an LD, the optical subassembly 2700 emits an optical signal generated by the LD, through the lens member 2740. When the optoelectronic converting element 2720 is a PD, the optical subassembly 2700 receives an optical signal entering through the lens member 2740. The metal cap 2730 is fitted with a ferrule, etc., to connect an optical fiber thereto.

FIG. 28 is a front cross-sectional view of alignment of the optical axes of the conventional optical subassembly. In FIG. 28, a reference numeral "2721" denotes the optical axis of the optoelectronic converting element 2720. A reference numeral "2741" denotes the optical axis of the lens member 2740. In the conventional optical subassembly 2700, to improve its optical property, the lens member 2740 is positioned relative to the optoelectronic converting element 2720 that is disposed on the wiring substrate 2710 such that the optical axis 2721 and the optical axis 2741 coincide with each other.

When the optoelectronic converting element 2720 is an LD, an optical signal that is emitted from the LD and that passes though the lens member 2740 is monitored and the lens member 2740 is positioned such that the intensity of the optical signal monitored becomes maximal. When the optoelectronic converting element 2720 is a PD, an electrical signal output from the PD based on an optical signal entering through the lens member 2740 is monitored and the lens member 2740 is positioned such that the intensity of the monitored electrical signal becomes maximal.

When the lens member 2740 is positioned, the metal cap 2730 is fixed on the wiring substrate 2710 by a method such as soldering. Thereby, the optoelectronic converting element 2720 is hermetically sealed by the wiring substrate 2710 and the metal cap 2730. A space having the optoelectronic converting element 2720 hermetically sealed therein has a shape of, for example, a cylinder having the diameter of 5 to 6 mm and the height of 5 to 6 mm.

When the optoelectronic converting element 2720 is positioned on the wiring substrate 2710, self-alignment is used where electrodes of the optoelectronic converting element 2720 are disposed on solder bumps disposed on the wiring substrate 2710; the solder bumps are heated and melted; and thereby, the optoelectronic converting element 2720 is positioned on the wiring substrate 2710 in a self-aligning manner due to the surface tension of the melted solder bumps.

However, in the above conventional technique, the metal cap 2730 to hermetically seal the optoelectronic converting element 2720 is necessary and, therefore, a problem arises in that the optical subassembly 2700 becomes large (for example, the diameter is 5 mm and the height is 5 mm) because a coupling portion is present between the lens member 2740 and the metal cap 2730. Therefore, another problem arises in that, for example, the mounting density demanded in the optical interconnection (for example, arrangement at intervals of 0.25 mm) is unable to be satisfied.

Because the lens member 2740 is positioned by monitoring the output signal of the optoelectronic converting element 2720, another problem arises in that the positioning of the lens member 2740 takes time and, therefore, the manufacture of the optical subassembly 2700 also takes time. Because a monitoring apparatus that monitors the output signal of the optoelectronic converting element 2720 and a positioning apparatus that positions the lens member 2740 are necessary, another problem arises in that the manufacturing cost of the optical subassembly 2700 becomes high.

SUMMARY

According to an aspect of an embodiment, an optical subassembly manufacturing method includes forming connecting electrodes and a piece of high-melting-point glass on a wiring substrate; positioning on and connecting to the connecting electrodes, an optoelectronic converting element; disposing on the piece of high-melting-point glass, a piece of low-melting-point glass having a melting point lower than the piece of high-melting-point glass; and fixing to the piece of low-melting-point glass, a protruding portion of a lens member further having a lens portion. The protruding portion has a shape matching that of the piece of high-melting-point glass, and relative positions of the protruding portion and the optical axis of the lens portion are determined to correspond to relative positions of the connecting electrodes and the piece of high-melting-point glass. The fixing includes fixing the protruding portion of the lens member to the piece of high-melting-point glass via surface tension generated by melting the piece of low-melting-point glass.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a plan view of a lens member of the optical subassembly according to the first embodiment;

FIG. 4 is a flowchart of an example of a manufacturing process of the optical subassembly according to the first embodiment;

FIG. 5 is a process diagram that corresponds to step S401 depicted in FIG. 4;

DESCRIPTION OF EMBODIMENTS

Preferred embodiments of the present invention will be explained with reference to the accompanying drawings.

Figure 1:
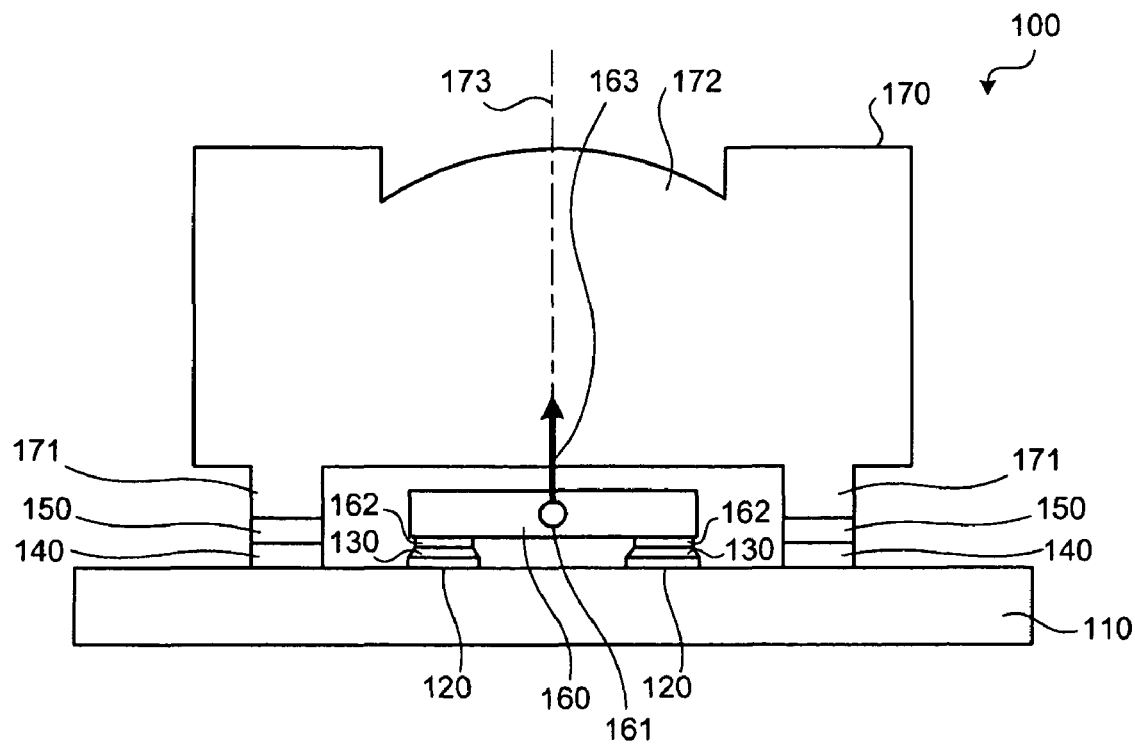
FIG. 1 is a front cross-sectional view of an optical subassembly according to a first embodiment.

FIG. 1 is a front cross-sectional view of an optical subassembly according to a first embodiment. An optical subassembly 100 according to the first embodiment is a TOSA that generates and emits an optical signal that corresponds to an electrical signal input thereto. As depicted in FIG. 1, the optical subassembly 100 includes a wiring substrate 110, connecting electrodes 120, solder bumps 130, high-melting-point glass 140, low-melting-point glass 150, an LD 160, and a lens member 170.

The wiring substrate 110 is a ceramic substrate made of, for example, alumina (aluminum oxide). The connecting electrodes 120 connect the wiring substrate 110 and the LD 160, and are formed on the wiring substrate 110. The solder bumps 130 (second low-melting-point members) have a melting point lower than that of the connecting electrodes 120, and are disposed on the connecting electrodes 120. The solder bumps 130 are made of an alloy of gold and tin (soldering metal).

The high-melting-point glass 140 (high-melting-point member) is formed on the wiring substrate 110 in a convex shape. The position of the high-melting-point glass is determined with respect to the wiring substrate 110, and the high-melting-point glass 140 is formed on the wiring substrate 110. The high-melting-point glass 140 is made of, for example, silica glass. The low-melting-point glass 150 (low-melting-point member) is a glass member that has a melting point lower than that of the high-melting-point glass 140. The low-melting-point glass 150 is disposed on the high-melting-point glass 140. The low-melting-point glass 150 is made of, for example, a silica glass combined with an impurity such as phosphorus or boron.

The LD 160 (optoelectronic converting element) is connected to the connecting electrodes 120 through the solder bumps 130. The LD 160 includes a light emitting unit 161, and electrodes 162 that transmit an electrical signal to the light emitting unit 161. The electrodes 162 of the LD 160 are disposed on the solder bumps 130. The LD 160 is hermetically sealed by the wiring substrate 110, the high-melting-point glass 140, the low-melting-point glass 150, and the lens member 170.

The lens member 170 includes a lens portion 172 and a protruding portion 171 that has a shape that matches that of the high-melting-point glass 140, i.e., the protruding portion 171 has coupling face of a shape that substantially matches the shape of the coupling face of the high-melting glass 140 when the protruding portion 171 is disposed on the high-melting glass 140. In particular, by forming the protruding portion 171 in a shape such that the coupling face thereof completely matches that of the counterpart, the precision of the positioning using the self-alignment effect described hereinafter is improved.

For example, the high-melting-point glass 140 and the protruding portions 171 each have a ring shape of the same radius, and the coupling faces of the glass 140 and the portions 171 each have a circular shape of the same radius. The lens member 170 is fixed on the high-melting-point glass 140 and the wiring substrate 110 by disposing the protruding portion 171 on the low-melting-point glass 150. With the lens member 170 positioned relative to the high-melting-point glass 140, the lens member 170 is coupled with the high-melting-point glass 140 by a self-alignment effect induced by causing the low-melting-point glass 150 to melt.

By forming the lens member 170, which includes the protruding portion 171 and the lens portion 172, of an integrated transparent member, the protruding portion 171 may be formed to be optically transparent. A transparent member that has a melting point higher than that of the low-melting-point glass 150 (for example, a melting point that is substantially identical to that of the high-melting-point glass 140) is used for the lens member 170. The optical axis 173 of the lens portion 172 of the lens member 170 coincides with the optical axis 163 of the light emitting unit 161 of the LD 160.

Figure 2:
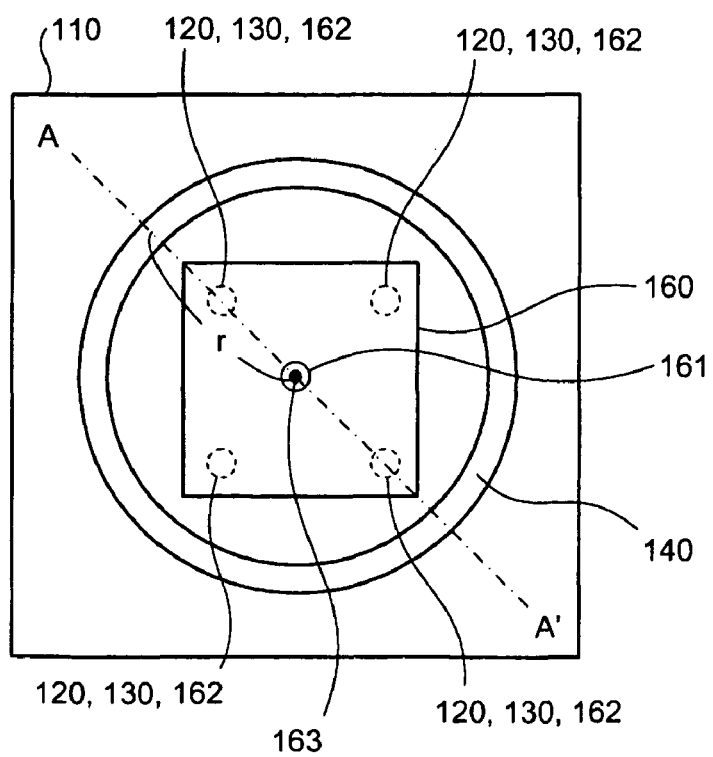
FIG. 2 is a plan view of a wiring substrate and an LD of the optical subassembly according to the first embodiment.

FIG. 2 is a plan view of the wiring substrate and the LD of the optical subassembly according to the first embodiment. FIG. 1 is a cross-sectional view taken along AA' of FIG. 2. As depicted in FIG. 2, the light emitting unit 161 is provided on a front face of the LD 160. The four electrodes 162 are provided on a back face of the LD 160. The four electrodes 162 are provided at four corners of the back face of the LD 160 such that the respective distances from the optical axis 163 of the light emitting unit 161 to the electrodes 162 are equivalent.

The four connecting electrodes 120 are formed on the wiring substrate 110, at positions that correspond to the four electrodes 162, and are coupled with the electrodes 162 of the LD 160 through the solder bumps 130. The high-melting-point glass 140 is formed into a ring shape (a doughnut shape) surrounding the connecting electrodes 120 on the wiring substrate 110.

The high-melting-point glass 140 is formed into a ring shape that has a radius of "r" and a center that is at a central point of the connecting electrodes 120, the central point being equidistance to each of the four connecting electrodes 120. The optical axis 163 of the LD 160 connected to the connecting electrodes 120 passes through the central point of the four connecting electrodes 120 and, therefore, the high-melting-point glass 140 is formed into a ring shape having a center at the optical axis 163 of the LD 160.

In this case, each of the four electrodes 162 of the LD 160 has a shape that matches the shape of its counterpart among the four connecting electrodes 120. In a state where the four electrodes 162 are positioned relative to the four connecting electrodes 120, the four electrodes 162 of the LD 160 are coupled with the four connecting electrodes 120 by the self-alignment effect induced by causing the four solder bumps 130 to melt.

FIG. 3 is a plan view of the lens member of the optical subassembly according to the first embodiment. As depicted in FIG. 3, the lens portion 172 of the lens member 170 is provided on the front face of the lens member 170 and the protruding portion 171 is provided on the back face of the lens member 170. The protruding portion 171 of the lens member 170 is formed into a ring shape that matches the shape of the high-melting-point glass 140. The relative positions of the protruding portion 171 and the optical axis 173 of the lens member 170 are determined corresponding to the relative positions of the connecting electrodes 120 and the high-melting-point glass 140.

In this case, the high-melting-point glass 140 is ring-shaped (see FIG. 2) having a radius of r and a center at the central point of the four connecting electrodes 120 and, thus, the protruding portion 171 of the lens member 170 is formed into a ring shape having a radius of r and a center at the optical axis 173 of the lens member 170. Therefore, by aligning and coupling the high-melting-point glass 140 and the protruding portion 171 of the lens member 170, the optical axis 163 (of the light emitting unit 161) passing through the central point of the four connecting electrodes 120, and the optical axis 173 of the lens member 172 coincide.

FIG. 4 is a flowchart of an example of the manufacturing process of the optical subassembly according to the first embodiment. As depicted in FIG. 4, the connecting electrodes 120 are formed at positions on the wiring substrate 110 where the electrodes 162 of the LD 160 are to be disposed (step S401). The position of the high-melting-point glass 140 relative to the positions of the connecting electrodes 120 formed at step S401 is determined and the high-melting-point glass is formed on the wiring substrate 110 (step S402).

The low-melting-point glass 150 is disposed on the high-melting-point glass 140 formed at step S402 (step S403). The solder bumps 130 are disposed on the connecting electrodes 120 formed at step S401 (step S404). The LD 160 is disposed on the solder bumps 130 disposed at step S404 (step S405).

The LD 160 is positioned relative to the wiring substrate 110 by melting the solder bump 130 (step S406). The LD 160 is fixed on the wiring substrate 110 by cooling the solder bumps 130 (step S407). The lens member 170 is disposed on the low-melting-point glass 150 disposed at step S403 (step S408).

The lens member 170 is positioned relative to the wiring substrate 110 by melting the low-melting-point glass 150 (step S409). The lens member 170 is fixed on the wiring substrate 110 by cooling the low-melting-point glass 150 (step S410) and a series of processing for manufacture of the optical subassembly 100 ends.

Figure 6:
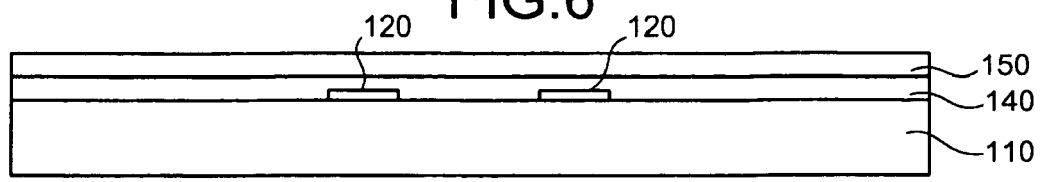
FIGS. 6 to 9 are process diagrams (Part I) to (Part IV) that correspond to steps S402 and S403 depicted in FIG. 4.

FIG. 5 is a process diagram that corresponds to step S401 of FIG. 4. In this process, four connecting electrodes 120 are formed at positions, on the wiring substrate 110, that correspond to the positions of the four electrodes 162 of the LD 160. FIGS. 6 to 9 are process diagrams (Part I) to (Part IV) that correspond to steps S402 and S403 of FIG. 4. As depicted in FIG. 6, a layer of the high-melting-point glass 140 and a layer of the low-melting-point glass 150 are deposited on the wiring substrate 110 in this order using a chemical vapor deposition method, etc.

Figure 7:
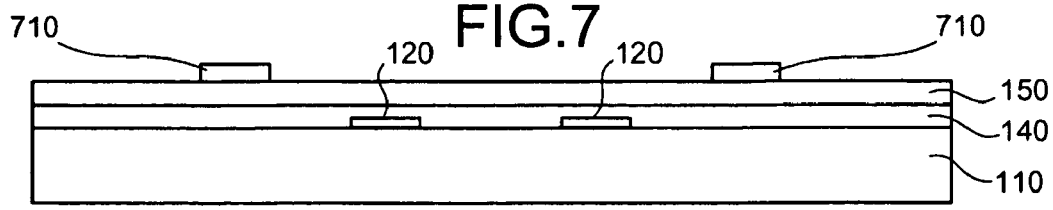
Figure 8:
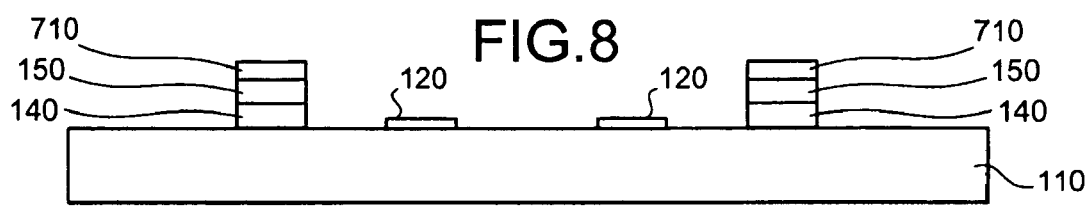

As depicted in FIG. 7, a layer of photo-resist 710 is patterned into a ring shape on the low-melting-point glass 150 such that the positions of the high-melting-point glass 140 and the connecting electrodes 120 relative to each other after etching are the positions described above. As depicted in FIG. 8, the portions of the high-melting-point glass 140 and the low-melting-point glass 150 on which the photo-resist 710 is not patterned, are removed using a chemical ion etching method, etc.

Figure 9:
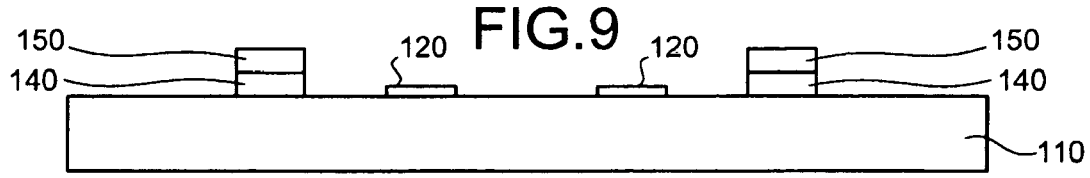
Figure 10:
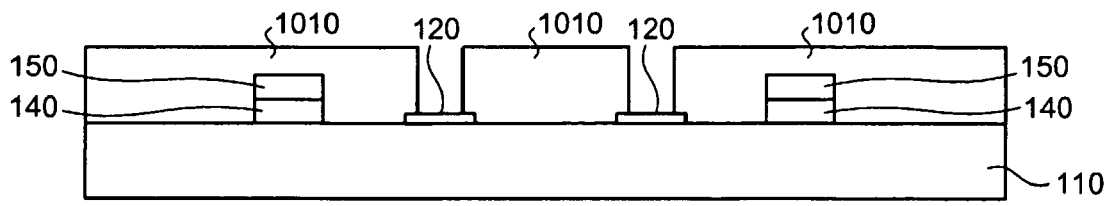
FIGS. 10 to 12 are process diagrams (Part I) to (Part III) that correspond to step S404 depicted in FIG. 4.
Figure 11:
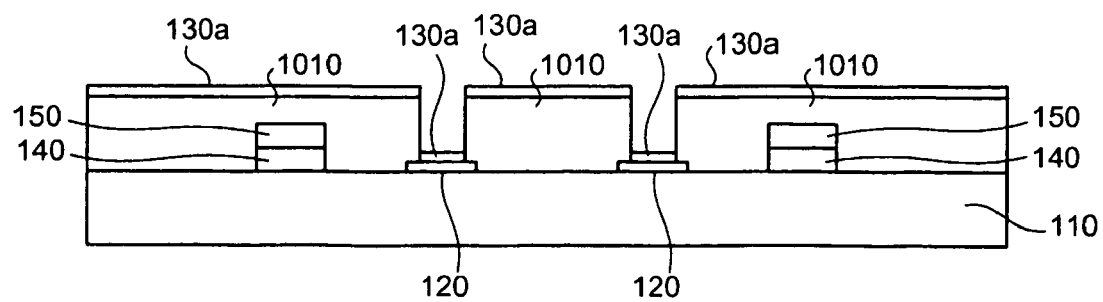
Figure 12:
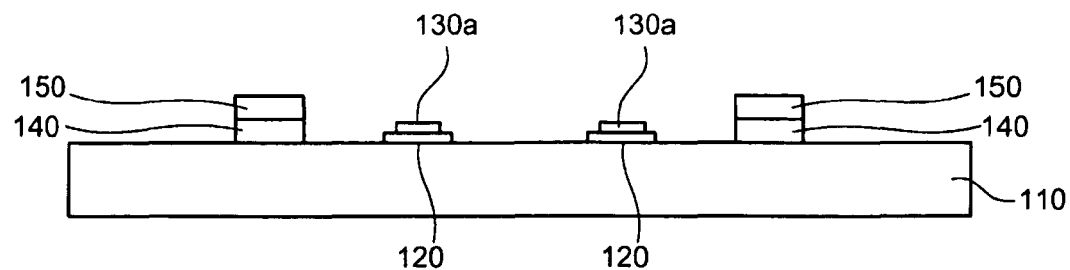

As depicted in FIG. 9, the photo-resist 710 is removed by ashing and cleaning using oxygen plasma. Thereby, the high-melting-point glass 140 and the low-melting-point glass 150 are formed in a ring-shape on the wiring substrate 110. FIGS. 10 to 12 are process diagrams (Part I) to (Part III) that correspond to step S404 of FIG. 4. As depicted in FIG. 10, photo-resist 1010 is patterned on a portion excluding the connecting electrodes 120 of the face of the wiring substrate 110.

As depicted in FIG. 11, a layer of solder metal 130a is deposited using a vacuum deposition method, etc. As depicted in FIG. 12, the photo-resist 1010 and the solder metal 130a on the photo-resist 1010 are removed using a lift-off method of infiltrating an organic solvent such as acetone, etc. Thereby, the solder metal 130a remaining on the connecting electrodes 120 will be handled as the solder bumps 130 in the following description.

Figure 13:
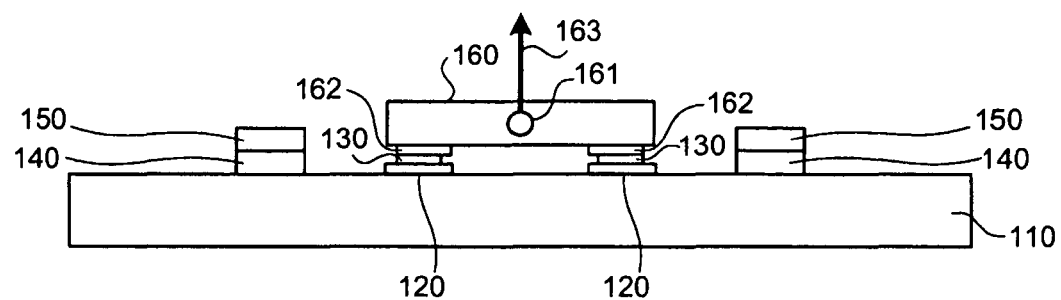
FIG. 13 is a process diagram that corresponds to step S405 depicted in FIG. 4.

FIG. 13 is a process diagram that corresponds to step S405 of FIG. 4. As depicted in FIG. 13, the electrodes 162 of the LD 160 are disposed on the solder bumps 130. In this process, the electrodes 162 of the LD 160 do not need to be accurately positioned on the solder bumps 130 and the electrodes 162 merely have to be placed on the solder bumps 130.

Figure 14:
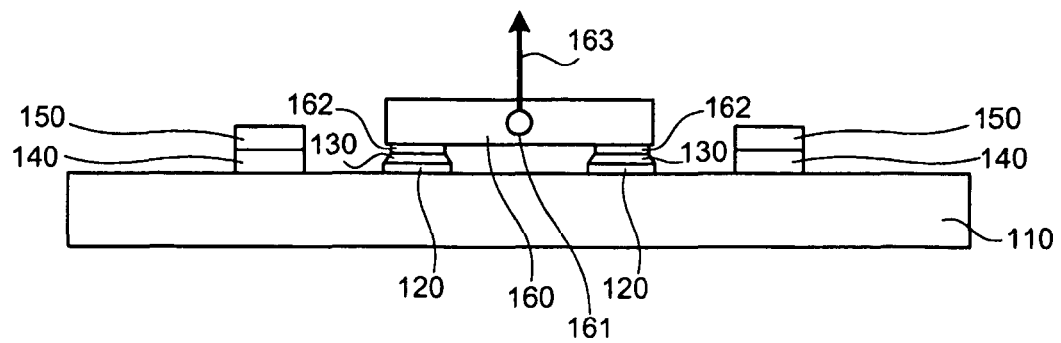
FIG. 14 is a process diagram that corresponds to steps 406 and S407 depicted in FIG. 4.

FIG. 14 is a process diagram that corresponds to steps 406 and S407 of FIG. 4. At step S406, for example, the wiring substrate 110 and all of the elements on the wiring substrate 110 are heated to about 300° C. and the solder bumps 130 alone are melted. In this case, the melting point of all the elements except the solder bumps 130 are set to be higher than 300° C. When the solder bumps 130 are melted, the electrodes 162 of the LD 160 are uniquely positioned relative to the connecting electrodes 120 by the self-alignment effect due to the surface tension of the melted solder bumps 130 as depicted in FIG. 14.

Therefore, the LD 160 may be positioned at a predetermined position on the wiring substrate 110. The LD 160 may then be fixed being positioned on the wiring substrate 110 by cooling and solidifying the melted solder bumps 130. The cooling of the melted solder bumps 130 is executed by, for example, self-cooling.

Figure 15:
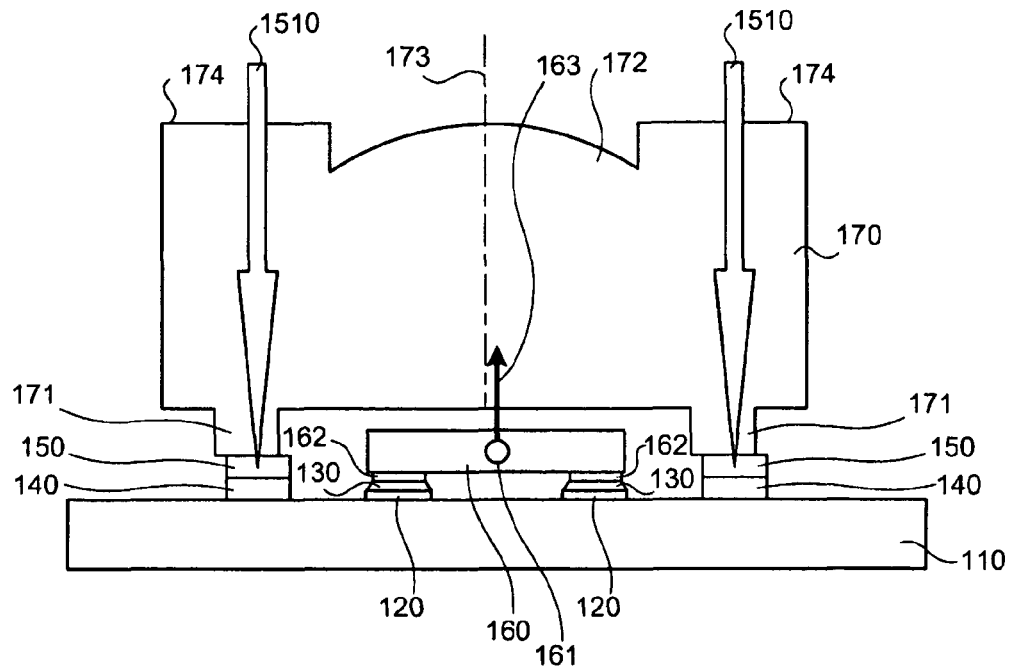
FIG. 15 is a process diagram that corresponds to step S408 depicted in FIG. 4.

FIG. 15 is a process diagram that corresponds to step S408 of FIG. 4. As depicted in FIG. 15, the protruding portion 171 of the lens member 170 is disposed on the low-melting-point glass 150. In this process, the protruding portion 171 does not need to be accurately positioned on the low-melting-point glass 150 and the protruding portion 171 merely has to be placed on the low-melting-point glass 150.

A process diagram that corresponds to steps S409 and S410 of FIG. 4 is identical to that of FIG. 1 and illustration thereof is omitted. To melt the low-melting-point glass 150, for example, a laser beam is applied to the low-melting-point glass 150. A femtosecond laser beam is used as the laser beam to be applied to the low-melting-point glass 150. Thereby, the low-melting-point glass 150 may instantaneously be heated.

The protruding portion 171 of the lens member 170 has optical transparency that causes a laser beam to pass therethrough. Thereby, as a reference numeral "1510" of FIG. 15 denotes, the temperature of the low-melting-point glass 150 may be increased and the low-melting-point glass 150 may be melted by emitting the laser beam to t he low-melting-point glass 150 through the protruding portion 171.

In this case, by focusing the laser beam on the low-melting-point glass 150, the temperature of the low-melting-point glass 150 may be increased locally due to a non-linear photo-absorption phenomenon (two-photon absorption). Therefore, the low-melting-point glass 150 may be melted without damaging the elements around the low-melting-point glass 150 such as the solder bumps 130, the high-melting-point glass 140, the LD 160, and the lens member 170.

For example, the entire low-melting-point glass 150 may be melted simultaneously by emitting a laser beam to the low-melting-point glass 150 along its ring shape by rotating the laser emitting apparatus. The time needed for the low-melting-point glass 150 that has been melted by a laser beam to become re-solidified by self-cooling is represented by "Δt" and the cycle for the laser beam spot to rotate along the ring of the low-melting-point glass 150 is represented by "T".

In this case, the entire low-melting-point glass 150 may simultaneously be melted by controlling the application energy of a laser pulse (10 to 100 nJ/pulse), the pulse generation frequency (1,000 to 10,000 pulse/second), and the beam moving speed (0.1 to 10 mm/s) such that the cycle T is shorter than the time period Δt. Multiple laser emitting apparatuses may be prepared and the emitting apparatuses may be rotated along the ring of the low-melting-point glass 150.

For example, two emitting apparatuses are provided at opposing positions from each other on the ring of the low-melting-point glass 150 and are rotated and, thereby, a laser beam is applied to the low-melting-point glass 150 twice in one round. Hence, the moving speed of the beams (the rotation speed of the laser beam emitting apparatuses) may be reduced to, for example, a half of the original speed. Preferably, the application of the laser beam to the low-melting-point glass 150 is executed in a dry nitrogen atmosphere.

An entrance portion 174 for a laser beam of the lens member 170 to apply the laser beam to the low-melting-point glass 150 through the protruding portion 171 is formed parallel to the coupling face between the protruding portion 171 and the low-melting-point glass 150. Thereby, when the laser beam is vertically emitted into the entrance portion 174, the laser beam travels straight to the low-melting-point glass 150 and, therefore, the laser beam is applied to the low-melting-point glass 150 at high precision.

An anti-reflection coating may be applied to the surface of the entrance portion 174. Thereby, reflection of the laser beam at the entrance portion 174 may be prevented and the laser beam may efficiently be applied to the low-melting-point glass 150. The entrance portion 174 and the protruding portion 171 are formed such that the distance between the entrance portion 174 and the coupling face of the protruding portion 171 with the low-melting-point glass 150 is equal at all points of the protruding portion 171 that is formed into a ring. Thereby, the beam focus of the laser may be fixed when the laser beam is applied to the low-melting-point glass 150 while rotating the laser beam emitting apparatus.

When the low-melting-point glass 150 is melted, as depicted in FIG. 1, the protruding portion 171 of the lens member 170 is uniquely positioned relative to the high-melting-point glass 140 by the self-alignment effect due to the surface tension of the melted low-melting-point glass 150. Thus, the lens member 170 is positioned at a predetermined position on the wiring substrate 110, and the optical axis 163 of the LD 160 and the optical axis 173 of the lens member 170 coincide with each other with high precision.

The melted low-melting-point glass 150 is cooled and solidified and, thereby, the lens member 170 is fixed being positioned on the wiring substrate 110. The cooling of the melted low-melting-point glass 150 is executed by, for example, self-cooling. Thereby, the LD 160 is hermetically sealed by the wiring substrate 110, the high-melting-point glass 140, the low-melting-point glass 150, and the lens member 170.

As described, according to the method of manufacturing the optical subassembly 100 and the optical subassembly 100 according to the first embodiment, the lens member 170 may automatically and precisely be positioned at a high speed relative to the wiring substrate 110 and the high-melting-point glass 140 using the self-alignment effect due to the surface tension of the melted low-melting-point glass 150. Therefore, the manufacturing time of the optical subassembly 100 may be reduced and reduction of the cost of the optical subassembly 100 may be facilitated.

For example, in the method of manufacturing the optical subassembly 100 according to the first embodiment, the positioning of the lens member 170 and the hermetical sealing of the LD 160 are simultaneously executed by the melting of the low-melting-point glass 150 and, therefore, the working time necessary for these processes may be reduced to about 10 seconds, the time necessary for the melting and the cooling of the low-melting-point glass 150.

By forming the protruding portion 171, the high-melting-point glass 140, and the low-melting-point glass 150 of the lens member 170 into a ring shape surrounding the LD 160, the LD 160 may be hermetically sealed by the lens member 170 without using any metal cap. Therefore, the optical subassembly 100 is reduced in size. The coupling portion of the optical subassembly 100 may be reduced and, thus, the optical subassembly 100 is configured with high precision. The number of parts of the optical subassembly 100 is reduced and a cost reduction of the optical subassembly 100 is facilitated.

The protruding portion 171 of the lens member 170 is optically transparent and a laser beam passing through the protruding portion 171 is applied to the low-melting-point glass 150 and, thereby, the low-melting-point glass 150 alone is easily heated and melted. Therefore, the low-melting-point glass 150 may be melted without damaging elements near the low-melting-point glass 150. Since, as a property of a lens the lens portion 172 is optically transparent, the protruding portion 171 is easily made to be optically transparent by forming the lens member 170 using an integrated transparent member.

The low-melting-point glass 150 is formed into a ring shape and by emitting a laser beam to the low-melting-point glass 150 while rotating the laser beam emitting apparatus, the entire low-melting-point glass 150 is efficiently heated and melted. By providing multiple laser beam emitting apparatuses to be rotated, the entire low-melting-point glass 150 may be more efficiently heated and melted.

By forming the connecting electrodes 120 and the high-melting-point glass 140 using lithography, the positions of the connecting electrodes 120 relative to the position of the high-melting-point glass 140 may precisely be determined. By using the self-alignment effect of the solder bumps 130 and the low-melting-point glass 150, the LD 160 and the lens member 170, respectively, are positioned precisely with respect to the connecting electrodes 120 and the high-melting-point glass 140. Therefore, the optical axis 163 of the LD 160 and the optical axis 173 of the lens member 170 are easily and precisely matched with each other and, thus, the optical property of the optical subassembly 100 is improved.

For example, the positioning precision of the connecting electrodes 120 and the high-melting-point glass 140 by lithography is ±0.1 µm; the positioning precision of the LD 160 using the self-alignment effect by the solder bumps 130 is 0.5 µm or less; the positioning precision of the lens member 170 using the self-alignment effect by the low-melting-point glass 150 is 0.5 µm or less; and the positioning precision obtained by totaling the above is up to ±1.2 µm.

Thereby, the optical axis adjustment precision required in the positioning of the optical axis 173 of the lens member 170 and the optical axis 163 of the LD 160 (for example, ±2.5 µm or less) may be satisfied. By using glass members such as the high-melting-point glass 140 and the low-melting-point glass 150 as high-melting-point members and low-melting-point members, the strength and the corrosion resistance of the coupling portion between the wiring substrate 110 and the lens member 170 are improved and, therefore, the LD 160 is able to be stably hermetically sealed.

Figure 16:
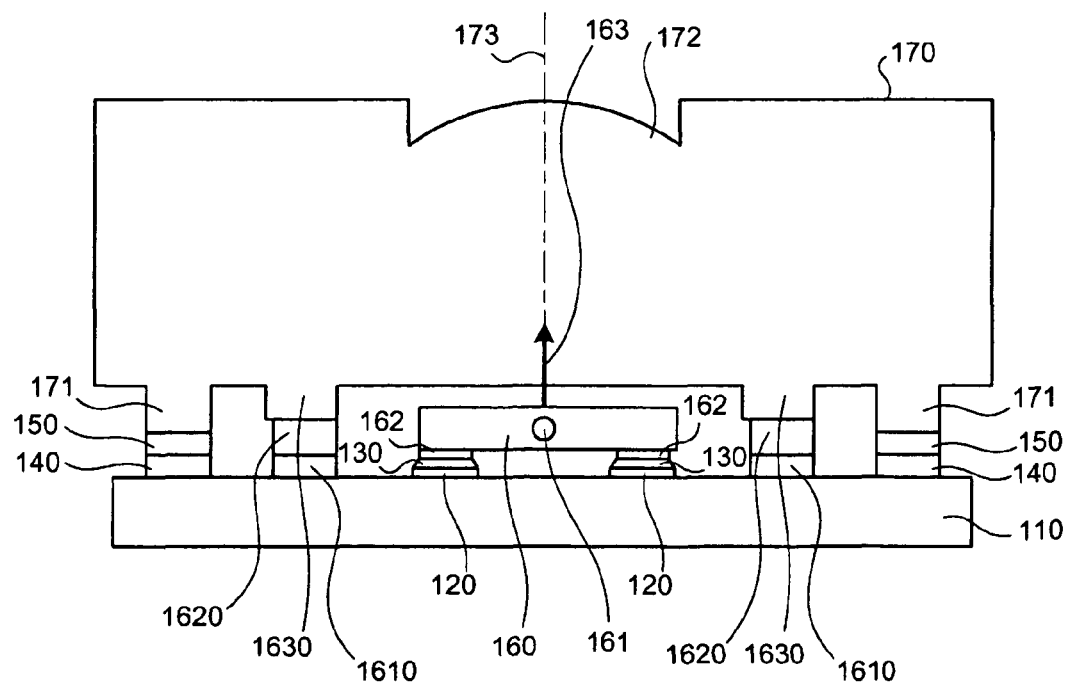
FIG. 16 is a cross-sectional view of an optical subassembly according to a second embodiment.
Figure 17:
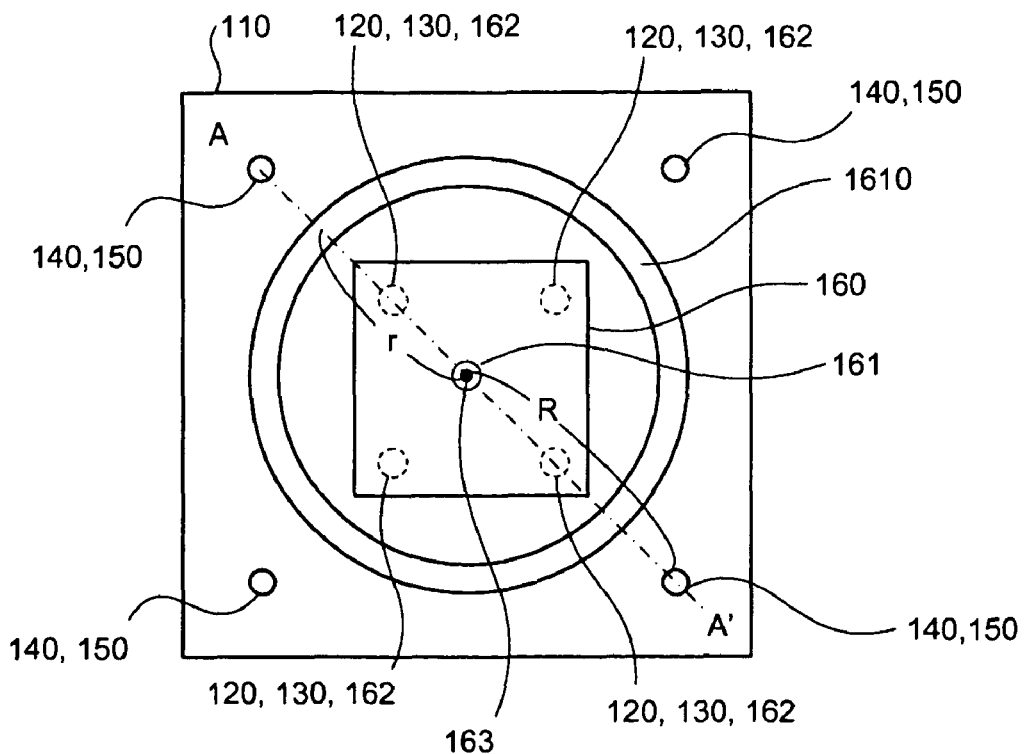
FIG. 17 is a plan view of the wiring substrate and the LD of the optical subassembly according to the second embodiment.

FIG. 16 is a cross-sectional view of an optical subassembly according to a second embodiment. FIG. 17 is a plan view of the wiring substrate and the LD of the optical subassembly according to the second embodiment. In FIGS. 16 and 17, components identical to the components depicted in FIGS. 1 and 2 are given the same reference numerals used in FIGS. 1 and 2, and the description thereof is omitted. FIG. 16 is a cross-sectional view taken along AA' of FIG. 17.

As depicted in FIGS. 16 and 17, four pieces of high-melting-point glass 140 are formed interspersed on the wiring substrate 110 of the optical subassembly 100 according to the second embodiment. The four pieces of high-melting-point glass 140 in this embodiment are each formed into a convex cylinder. The four pieces of high-melting-point glass 140 are provided on the wiring substrate 110 at equal intervals on a circle having a radius of "R" and a center at the optical axis 163 of the LD 160. Four pieces of low-melting-point glass 150 are provided corresponding to the four pieces of high-melting-point glass 140 and are disposed on the pieces the high-melting-point glass 140, respectively.

High-melting-point glass 1610 (a second high-melting-point member) is formed on the wiring substrate 110 in addition to the four pieces of high-melting-point glass 140. The high-melting-point glass 1610 is formed into a ring shape (a doughnut shape) surrounding the connecting electrodes 120 on the wiring substrate 110. The high-melting-point glass 1610 is formed into a ring shape having a radius of "r" and a center at the central point of the four connecting electrodes 120. The high-melting-point glass 1610 is made of, for example, the same material as that of the high-melting-point glass 140.

A protruding portion 1630 of the lens member 170 is optically transparent thereby allowing a laser beam to pass therethrough. For example, the lens member 170 that includes the protruding portion 171, the lens portion 172, and the protruding portion 1630 are configured by an integrated transparent member and, thereby, the protruding portion 171 and the protruding portion 1630 may be formed to be optically transparent.

The optical axis 163 of the light emitting unit 161 of the LD 160 that is connected to the connecting electrodes 120 passes through the central point of the four connecting electrodes 120 and, therefore, the high-melting-point glass 1610 is formed into a ring shape having a center at the optical axis 163 of the light emitting unit 161 of the LD 160. Low-melting-point glass 1620 (a third low-melting-point member) that has a melting point lower than that of the high-melting-point glass 1610 is disposed on the high-melting-point glass 1610.

The low-melting-point glass 1620 is made of, for example, the same material as that of the low-melting-point glass 150. Four protruding portions 171 of the lens member 170 are provided corresponding to the four pieces of high-melting-point glass 140. The lens member 170 further has a ring-shaped protruding portion 1630 that matches the high-melting-point glass 1610.

The lens member 170 is fixed to the wiring substrate 110 in a state where each of the four protruding portions 171 is disposed on each of the pieces of low-melting-point glass 150 and the protruding portion 1630 is disposed on the low-melting-point glass 1620. The lens member 170 is positioned relative to the high-melting-point glass 140 by melting the four pieces of low-melting-point glass 150.

Figure 18:
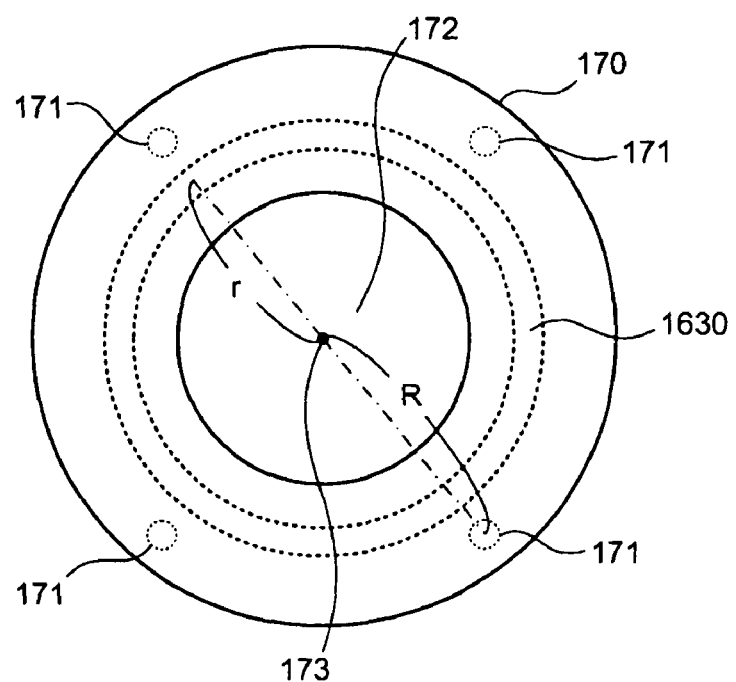
FIG. 18 is a plan view of the lens member of the optical subassembly according to the second embodiment.

FIG. 18 is a plan view of the lens member of the optical subassembly according to the second embodiment. In FIG. 18, components identical to the components depicted in FIG. 3 are given the same reference numerals used in FIG. 3, and the description thereof is omitted. As depicted in FIG. 18, the lens member 170 has the four protruding portions 171 that match the four pieces of high-melting-point glass 140. The four protruding portions 171 are each formed into a convex cylinder matching the convex cylinder shapes of the pieces of high-melting-point glass 140. The four protruding portions 171 provided at equal intervals on the circle having the radius of "R" and a center at the optical axis 173 of the lens portion 172.

The protruding portion 1630 of the lens member 170 is formed into a ring shape matching the high-melting-point glass 1610. The positions of the protruding portion 1630 of the lens member 170 and the optical axis 173 of the lens portion 172 relative to each other are determined corresponding to the positions of the connecting electrodes 120 and the pieces of high-melting-point glass 140 relative to each other. In this embodiment, the protruding portion 1630 of the lens member 170 is formed into a ring shape having the radius of "r" and a center at the optical axis 173 of the lens portion 172 of the lens member 170.

Thereby, the four pieces of high-melting-point glass 140 and the four protruding portions 171 are positioned relative to each other by melting the four pieces of low-melting-point glass 150. By cooling the melted four pieces of low-melting-point glass 150, the four pieces of high-melting-point glass 140 and the four protruding portions 171 are coupled with and fixed to each other, each being positioned relative to the other. Therefore, the optical axis 173 of the lens portion 172 and the optical axis 163 of the light emitting unit 161 that passes through the central point of the four pieces of high-melting-point glass 140 coincide with each other.

By melting and cooling the low-melting-point glass 1620, the high-melting-point glass 1610 and the protruding portion 1630 of the lens member 170 are coupled with and fixed to the low-melting-point glass 1620. Thereby, the LD 160 is hermetically sealed by the wiring substrate 110, the high-melting-point glass 1610, the low-melting-point glass 1620, and the lens member 170.

Figure 19:
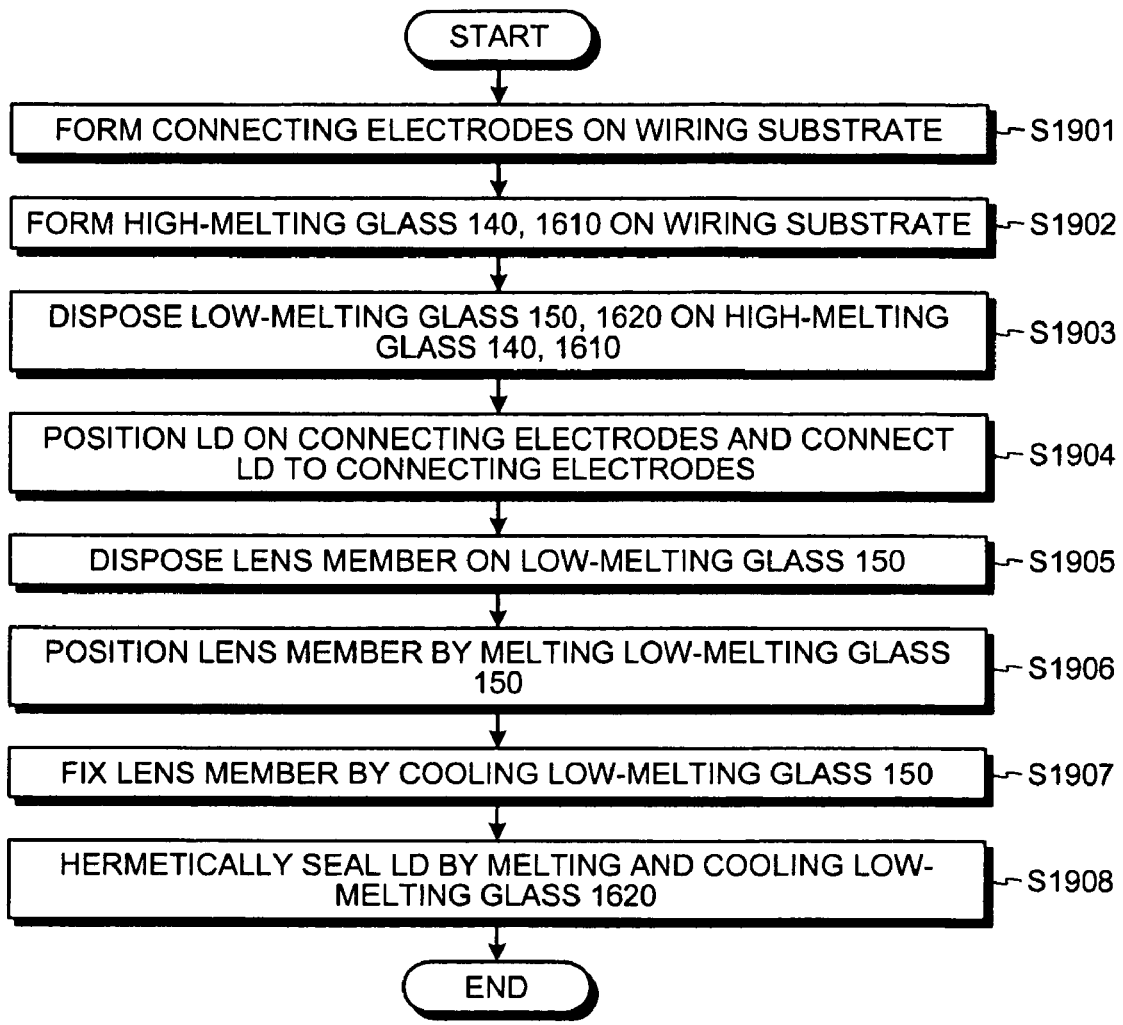
FIG. 19 is a flowchart of an example of the manufacturing process of the optical subassembly according to the second embodiment.

FIG. 19 is a flowchart of an example of the manufacturing process of the optical subassembly according to the second embodiment. As depicted in FIG. 19, the connecting electrodes 120 are formed at positions on the wiring substrate 110 where the electrodes 162 of the LD 160 are to be disposed (step S1901). The formation of the connecting electrodes 120 follows the process steps in the process diagram depicted in FIG. 5 and, therefore, description is omitted.

The positions of the four pieces of high-melting-point glass 140 and the high-melting-point glass 1610 relative to that of the four connecting electrodes 120 formed at step S1901 are determined and the pieces of high-melting-point glass 140 and 1610 are formed on the wiring substrate 110 (step S1902). The four pieces of low-melting-point glass 150 and the low-melting-point glass 1620 are respectively disposed on the four pieces of high-melting-point glass 140 and the high-melting-point glass 1610 formed at step S1902 (step S1903).

More specifically, in the process diagrams depicted in FIGS. 6 to 9, by patterning the photo-resist 710 on the four pieces of low-melting-point glass 150 such that the positions of the four pieces of low-melting-point glass 150 relative to those of the connecting electrodes 120, the four pieces of high-melting-point glass 140, and the high-melting-point glass 1610, are the positions described above, the four pieces of high-melting-point glass 140 and the high-melting-point glass 1610 are formed and the four pieces of low-melting-point glass 150 and the low-melting-point glass 1620 are disposed.

The LD 160 is positioned on the connecting electrodes 120 formed at step S1901 and is connected to the connecting electrodes 120 (step S1904). The positioning and the connection of the LD 160 follow the process diagrams depicted in FIGS. 10 to 14 and, therefore, detailed description is omitted. The lens member 170 is disposed on the four pieces of low-melting-point glass 150 disposed at step S1903 (step S1905).

The lens member 170 is positioned relative to the wiring substrate 110 by melting the low-melting-point glass 150 (step S1906). The lens member 170 is fixed on the wiring substrate 110 by cooling the low-melting-point glass 150 (step S1907). By melting and cooling the low-melting-point glass 1620, the high-melting-point glass 1610 and the protruding portion 1630 of the lens member 170 are coupled with each other and, thereby, the LD 160 is hermetically sealed (step S1908) and a series of processing for manufacture of the optical subassembly 100 ends.

Figure 20:
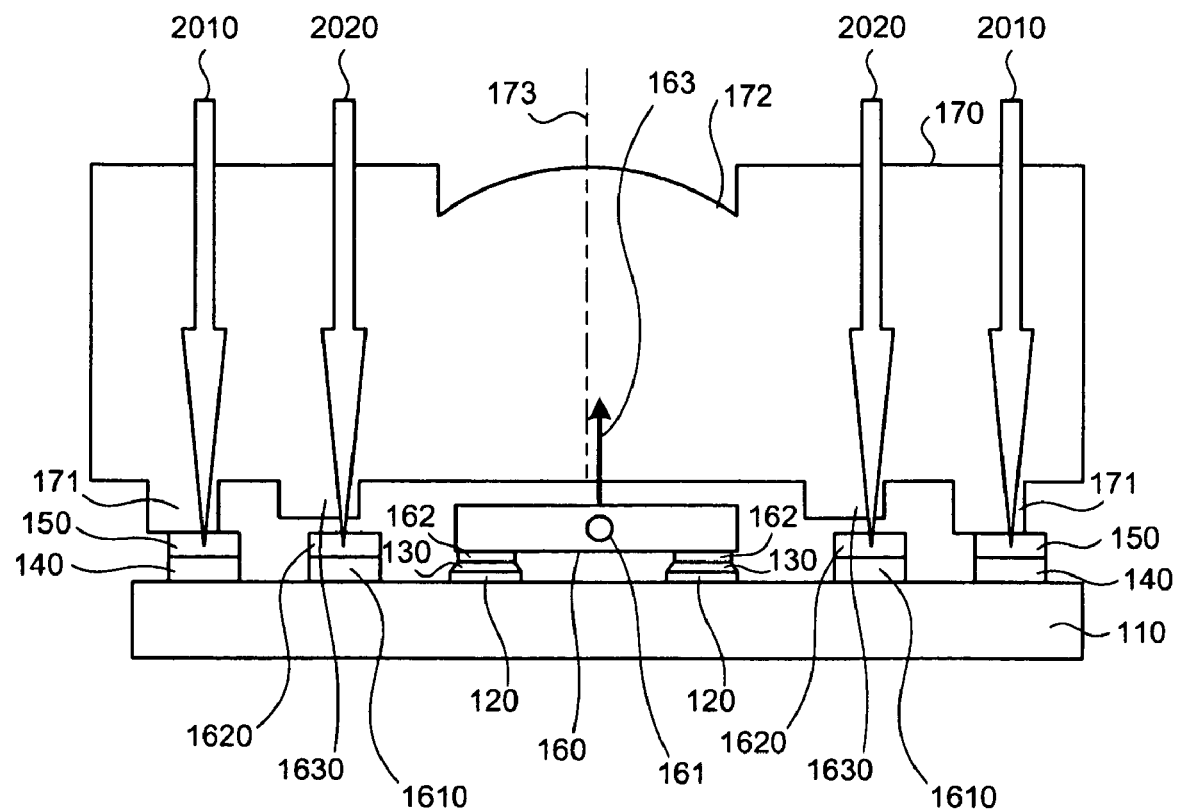
FIG. 20 is a process diagram that corresponds to steps S1906 to S1908 depicted in FIG. 19.

FIG. 20 is a process diagram that corresponds to steps S1906 to S1908 of FIG. 19. At step S1906, as denoted by a reference numeral "2010" of FIG. 20, the four pieces of low-melting-point glass 150 are melted by applying a laser beam such as a femtosecond laser beam to the pieces of low-melting-point glass 150 through the protruding portion 171 of the lens member 170.

The four pieces of low-melting-point glass 150 are provided to be interspersed corresponding to the four pieces of high-melting-point glass 140 and, therefore, simultaneous melting of the pieces of low-melting-point glass 150 becomes easy when laser beams are simultaneously applied to the pieces of low-melting-point glass 150 using four laser-beam emitting apparatuses. Therefore, the lens member 170 is precisely positioned relative to the wiring substrate 110, at a high speed.

At step S1908, as denoted by a reference numeral "2020", the low-melting-point glass 1620 is melted by applying a laser beam such as a femtosecond laser beam to the low-melting-point glass 1620 through the protruding portion 1630. Because the low-melting-point glass 1620 is formed into a ring shape, the low-melting-point glass 1620 may be melted by a method identical to that for the low-melting-point glass 150 according to the first embodiment.

In the second embodiment, because the positioning of the lens member 170 is completed at step S1906, precision in the positioning is not necessary at step S1908 and the LD 160 merely has to be hermetically sealed by the ring-shaped low-melting-point glass 1620. Therefore, the high-melting-point glass 1630 and the protruding portion 1630 of the lens member 170 do not need to be formed with such high precision as that for the pieces of high-melting-point glass 140 and the protruding portions 171 of the lens member 170.

For example, the protruding portion 1630 may be formed of a rather short length to avoid contacting the protruding portion 1630 with the low-melting-point glass 1620 when the protruding portions 171 of the lens member 170 are disposed on the pieces of low-melting-point glass 150. In this case, the protruding portion 1630 may not have a shape that precisely matches the low-melting-point glass 1620.

At step S1908, the protruding portion 1630 is melted by applying a laser beam to the protruding portion 1630 and, thereby, the melted protruding portion 1630 is caused to drop down by its own weight until the melted protruding portion 1630 comes into contact with the low-melting-point glass 1620. The low-melting-point glass 1620 is melted by applying a laser beam thereto and is coupled with the protruding portion 1630 and, thereby, the LD 160 is securely hermetically sealed.

As described, according to the manufacturing method of the optical subassembly 100 and the optical subassembly 100 according to the second embodiment, the same effect as that of the first embodiment is achieved; the lens member 170 is precisely positioned using the interspersed pieces of low-melting-point glass 150; and the LD 160 is hermetically sealed using the low-melting-point glass 1620 that is formed in a ring shape.

In the embodiments, a configuration is described in which a high-melting-point member is formed on the wiring substrate 110 by providing the pieces of high-melting-point glass 140, etc., on the wiring substrate 110. However, the wiring substrate 110 itself may be made of a high-melting material and the high-melting-point member may be formed on the wiring substrate 110 by making a portion of the wiring substrate 110 convex by, for example, providing a groove on the wiring substrate 110.

In the embodiments, a case where the optical subassembly 100 is configured as a TOSA by providing the LD 160 as the optoelectronic converting element on the connecting electrodes 120 is described. However, the optical subassembly 100 may be configured as a ROSA by providing a PD instead of the LD 160 on the connecting electrodes 120. In this case, the optical axis 173 of the lens portion 172 of the lens member 170 is caused to coincide with the optical axis of the PD (an optical path where the light-receiving sensitivity of the PD becomes highest).

In the embodiments, a configuration is described where the pieces of high-melting-point glass 140 and the pieces of low-melting-point glass 150 are used as the high-melting-point members and the low-melting-point members. However, the high-melting-point members and the low-melting-point members are not limited to the above glass members. Each high-melting-point member and each low-melting-point member may be a high-melting-point member and a low-melting-point member that each have a melting point different from that of each other and that may be coupled with each other by melting.

In the embodiments, a method of disposing the solder bumps 130 on the connecting electrodes 120 and disposing the electrodes 162 of the LD 160 on the solder bumps 130 is described. However, the method of positioning the LD 160 is not limited hereto. For example, the solder bumps 130 may be soldered in advance to the electrodes 162 of the LD 160, and the solder bumps 130 and the LD 160 may be disposed at one time on the connecting electrodes 120.

In the first embodiment, a configuration in which the high-melting-point glass 140 is formed into a ring shape (a doughnut shape) surrounding the connecting electrodes 120 on the wiring substrate 110 is described. However, the shape of the high-melting-point glass 140 is not limited to the ring shape. For example, the high-melting-point glass 140 may have a square-like ring shape surrounding the connecting electrodes 120 or may have an oval ring shape surrounding the connecting electrodes 120. Similarly, the same may be said of the high-melting-point glass 1610 according to the second embodiment.

In the first embodiment, a method of emitting a laser beam while rotating the laser beam emitting apparatus along the low-melting-point glass 150 is described. However, the method of emitting the laser beam is not limited hereto, and multiple laser beam emitting apparatuses may be arranged along the low-melting-point glass 150 and laser beams may be applied simultaneously to the entire low-melting-point glass 150. Similarly, the same may be said of the low-melting-point glass 1620 according to the second embodiment.

In the second embodiment, a configuration is described in which the four pieces of high-melting-point glass 140, the four pieces of low-melting-point glass 150, and the four protruding portions 171 of the lens member 170 are provided. However, the number of each of these components is not limited to four. For example, if each piece of the high-melting-point glass 140 is a cylinder, the positioning of the lens member 170 by the self-alignment effect may be executed by providing at least two of each of these components. Similarly, the same may be said of the connecting electrodes 120, the solder bumps 130, and the electrodes of the LD 160 in each of the embodiments.

In the second embodiment, a method of applying laser beams to the pieces of low-melting-point glass 150 using four laser beam emitting apparatuses, one for each of the pieces of low-melting-point glass 150 is described. However, the method of emitting laser beams is not limited hereto, and a laser beam may be applied to the four pieces of low-melting-point glass 150 sequentially by moving one laser beam emitting apparatus and, thereby, the four pieces of low-melting-point glass 150 may be melted simultaneously.

Figure 21:
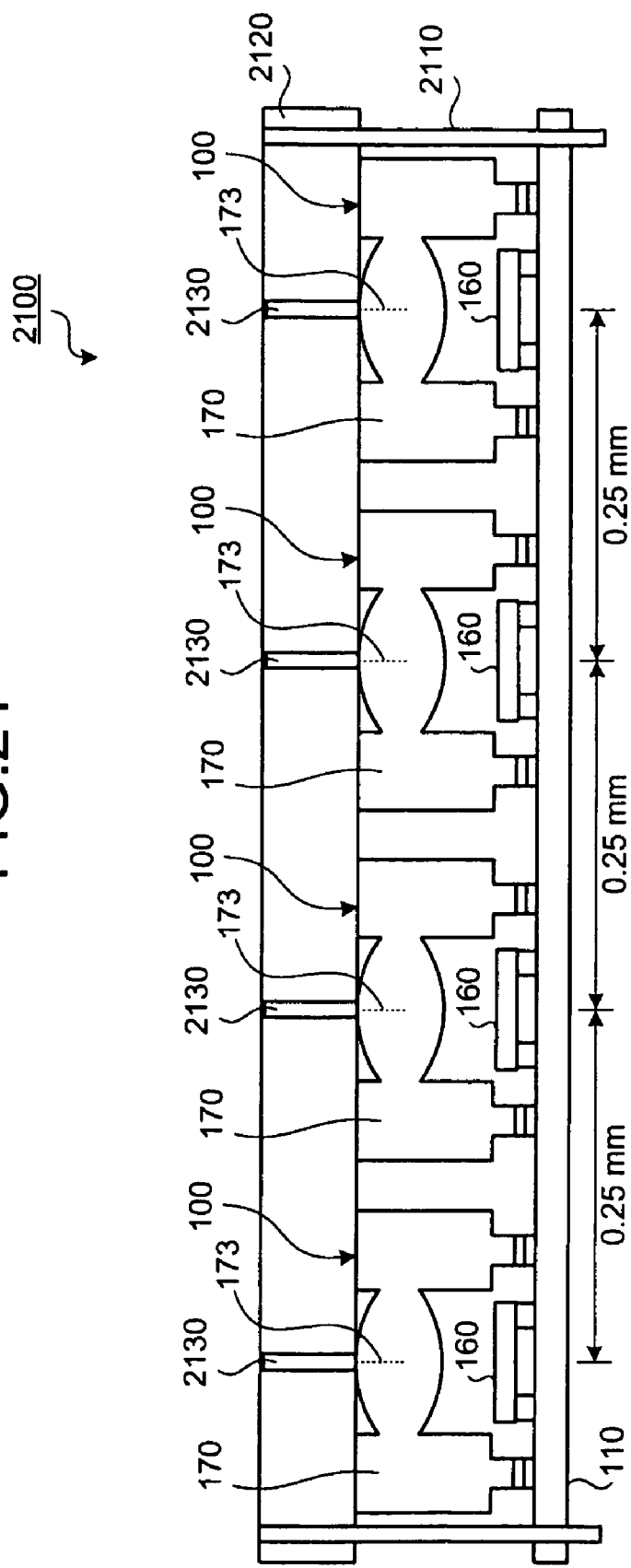
FIG. 21 is a front cross-sectional view of an OSA array according to a first example of the embodiments.

FIG. 21 is a front cross-sectional view of an OSA array according to a first example of the embodiments. The optical subassembly (OSA) array 2100 according to the first example of the present invention is an example formed by disposing multiple optical subassemblies 100 according to the first embodiment in an array. As depicted in FIG. 21, the OSA array 2100 includes the optical subassemblies 100, a guide pin 2110, a ferrule 2120, and optical fibers 2130.

Each of the optical subassemblies 100 includes the LD 160 and is configured as a TOSA. The optical subassemblies 100 are arranged in an array and the wiring substrates 110 are integrated. The optical subassemblies 100 are positioned relative to the wiring substrates 110 using the above self-alignment effect.

The guide pin 2110 fixes the ferrule 2120 to the integrated wiring substrates 110 of the plurality of optical subassemblies 100. The ferrule 2120 positions the optical fibers 2130 on the optical axis 173 of the lens member 170 of each of the optical subassemblies 100. The ferrule 2120 is, for example, a mechanically transferable (MT) ferrule.

Each of the optical subassemblies 100 emits an optical signal generated by its LD 160 through the optical fiber 2130 therefore. When each of the optical subassemblies 100 includes a PD instead of the LD 160 and is configured as a ROSA, the optical subassembly 100 converts an optical signal received through the optical fiber 2130 into an electrical signal.

According to the OSA array 2100 according to the first example of the present invention, the size of the optical subassembly 100 may be set to be about 0.2 mm (diameter)×0.2 mm (height). Therefore, the optical subassemblies 100 may be mounted in an array at intervals of 0.25 mm and the mounting density requirement in the optical interconnection is able to be satisfied.

Figure 22:
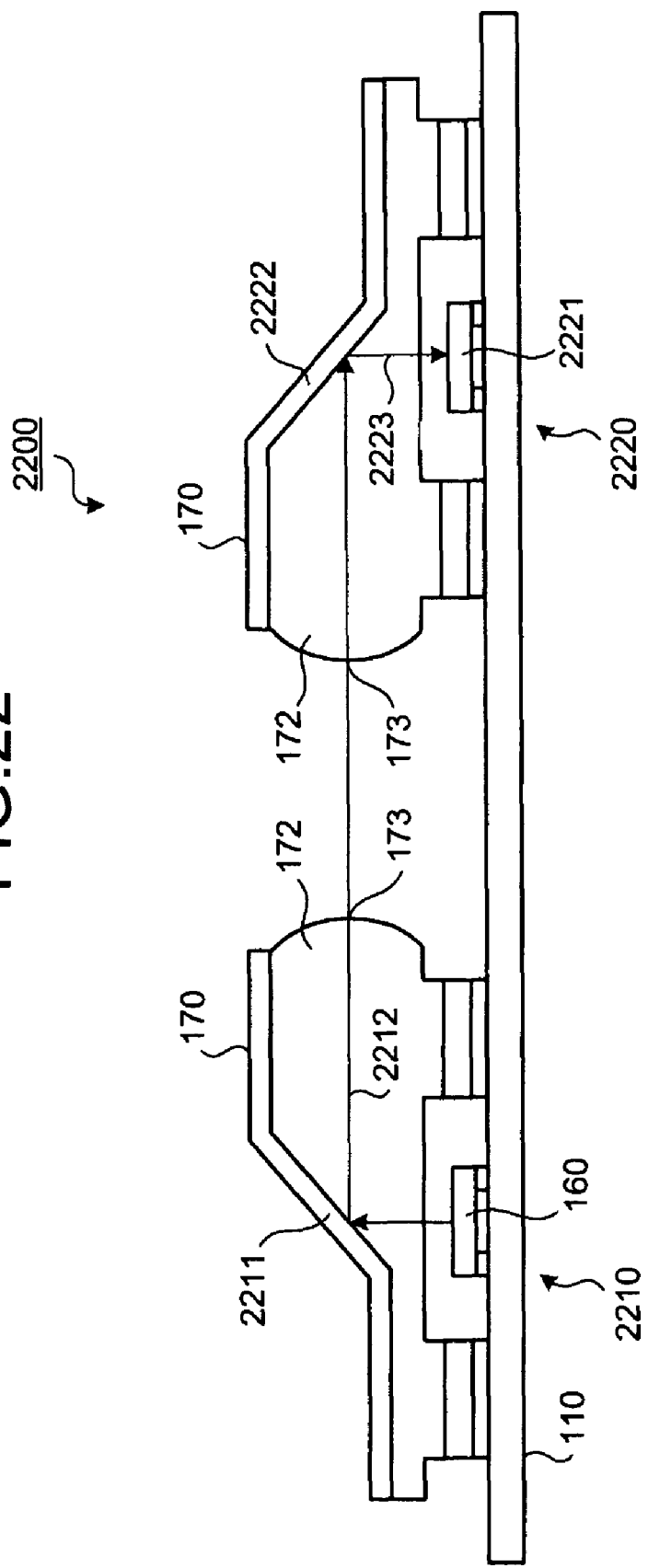
FIG. 22 is front cross-sectional view of an optical interconnecting device according to a second example of the embodiments.

FIG. 22 is front cross-sectional view of an optical interconnecting device according to a second example of the embodiments. The optical interconnecting device 2200 according to the second example is an example formed by applying the optical subassemblies 100 according to the first embodiment to an optical interconnecting device that transmits an optical signal by free space propagation on a chip or a board. As depicted in FIG. 22, the optical interconnecting device 2200 includes a TOSA 2210 and a ROSA 2220.

The TOSA 2210 has a configuration that includes, in an altered form, the lens member 170 in the optical subassembly 100 according to the first embodiment. The lens member 170 includes a reflecting mirror 2211 that reflects, at a right angle, a light beam vertically emitted from the LD 160. The lens portion 172 of the lens member 170 is provided at a position at which the lens portion 172 transmits therethrough the light beam that is emitted from the LD 160 and that is reflected by the reflecting mirror 2211.

The optical axis 173 of the lens portion 172 coincides with an optical path 2212 (predetermined optical path) of the light beam that is emitted from the LD 160 and that is reflected by the reflecting mirror 2211. Thereby, the light beam emitted from the LD 160 becomes parallel to the wiring substrate 110 and is emitted from the lens portion 172. The TOSA 2210 and the ROSA 2220 are mounted in the horizontal direction and the wiring substrates 110 of the TOSA 2210 and the ROSA 2220 are integrated.

The ROSA 2220 has a configuration that includes the lens member 170 in an altered form and further includes a PD 2221 instead of the LD 160 in the optical subassembly 100 according to the first embodiment. The lens portion 172 of the lens member 170 in the ROSA 2220 is provided at a position at which the lens portion 172 transmits therethrough the light beam horizontally emitted from the TOSA 2210. The optical axis 173 of the lens portion 172 coincides with the optical path 2212 of the light beam that is horizontally emitted from the TOSA 2210.

The lens member 170 includes a reflecting mirror 2222 that completely reflects at a right angle, the light beam that passes through the lens portion 172. The reflecting mirror 2222 is provided at a position where an optical axis 2223 of the reflected light beam coincides with the optical axis of the PD 2221. Thereby, the light beam horizontally emitted from the TOSA 2210 is received by the PD 2221. Thus, the optical interconnecting device 2200 transmits the optical signal via free space propagation from the TOSA 2210 to the ROSA 2220.

According to the optical interconnecting device 2200 according to the second example, the size of the optical subassembly 100 may be set to be about 0.2 mm (diameter)×0.2 mm (height). Therefore, the optical subassemblies 100 may be mounted, for example, at intervals of 0.25 mm and the mounting density requirement in an optical interconnecting device is able to be satisfied. The LD 160 and the lens member 170 of the TOSA 2210 and the ROSA 2220 are precisely positioned relative to the wiring substrate 110 and, therefore, the optical transmission precision may be improved.

Figure 23:
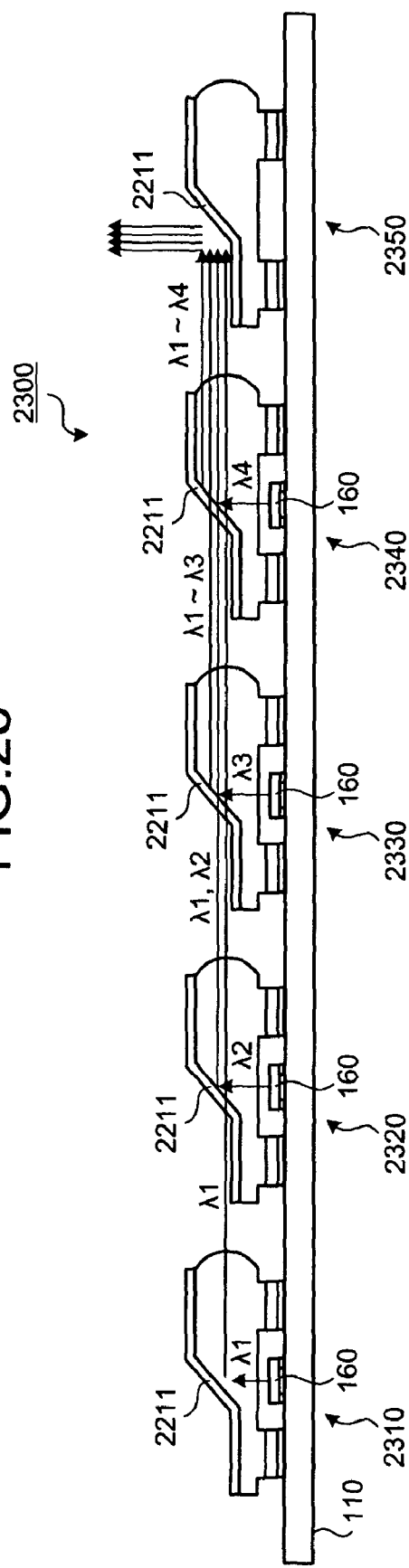
FIG. 23 is a front cross-sectional view of a WDM oscillator according to a third example of the embodiments.

FIG. 23 is a front cross-sectional view of a WDM oscillator according to a third example of the embodiments. The wavelength division multiplexing (WDM) oscillator 2300 according to the third example is an example obtained by applying the optical subassembly 100 according to the first embodiment to a wavelength division multiplexing oscillator that generates light beams having different wavelengths, multiplexes the generated light beams, and emits the multiplexed light beams.

As depicted in FIG. 23, the WDM oscillator 2300 includes TOSAs 2310, 2320, 2330, and 2340, and a reflecting member 2350. The TOSAs 2310, 2320, 2330, and 2340 respectively emit optical signals having the wavelengths $\lambda 1$ to $\lambda 4$. The TOSA 2310 is configured to have the LD 160 in the above TOSA 2210 and oscillating a light beam having the wavelength of $\lambda 1$.

The TOSA 2310 emits the optical signal of $\lambda 1$ to the TOSA 2320. The TOSAs 2310, 2320, 2330, and 2340 are mounted in the horizontal direction and the wiring substrates 110 of the TOSAs are integrated. The TOSA 2320 is configured to have a wavelength selecting mirror instead of the reflecting mirror 2211 in the above TOSA 2210 and the LD 160 that oscillates a light beam having the wavelength $\lambda 2$.

The reflecting mirror 2211 of the TOSA 2320 passes therethrough the light beam having the wavelength $\lambda 1$ and reflects the light beam having the wavelength $\lambda 2$. The reflecting mirror 2211 of the TOSA 2320 is provided at a position at which the reflecting mirror 2211 transmits therethrough the optical signal emitted from the TOSA 2310 and at which the reflecting mirror 2211 reflects the optical signal oscillated from the LD 160 of the TOSA 2320.

Thereby, the optical signal having the wavelength $\lambda 1$ that is emitted from the TOSA 2310 and that passes through the reflecting mirror 2211 of the TOSA 2320, and the optical signal having the wavelength $\lambda 2$ that is oscillated from the LD 160 of the TOSA 2320 and that is reflected by the reflecting mirror 2211 are superimposed and multiplexed. The TOSA 2320 emits the multiplexed optical signals ($\lambda 1$, $\lambda 2$) to the TOSA 2330.

The TOSAs 2330 and 2340 each have a configuration identical to that of the TOSA 2320 except the wavelength of the optical signal oscillated by the LD 160 of each of the TOSAs 2330 and 2340 differs. The TOSA 2330 multiplexes an optical signal having the wavelength $\lambda 3$ into the optical signal ($\lambda 1$, $\lambda 2$) emitted from the TOSA 2320, and emits the multiplexed optical signal ($\lambda 1$ to $\lambda 3$) to the TOSA 2340. The TOSA 2340 multiplexes an optical signal having the wavelength $\lambda 4$ into the optical signal ($\lambda 1$ to $\lambda 3$) emitted from the TOSA 2330, and emits the multiplexed optical signal ($\lambda 1$ to $\lambda 4$) to the reflecting member 2350.

The reflecting member 2350 has a configuration obtained by omitting the LD 160 in the above TOSA 2210. The reflecting member 2350 completely reflects the optical signal ($\lambda 1$ to $\lambda 4$) emitted from the TOSA 2340 at a right angle using the reflecting mirror 2211 and emits the optical signal to the side opposite to the wiring substrate 110. Thereby, the WDM oscillator 2300 emits the optical signal obtained by multiplexing the optical signals having the wavelengths $\lambda 1$ to $\lambda 4$.

According to the WDM oscillator 2300 of the third example, the optical subassemblies 100 may be mounted densely in an array by facilitating the downsizing of each of the optical subassemblies 100 and, therefore, downsizing as a WDM oscillator is further facilitated. Because the optical subassemblies 100 are able to be mounted densely in an array, the error of each of the wavelength components of an optical signal due to the difference in the optical path lengths between the optical subassemblies 100 is reduced.

The LDs 160 and the lens members 170 of the TOSAs 2310, 2320, 2330, and 2340 are precisely positioned relative to the wiring substrate 110 and, therefore, optical signals of different wavelength components are able to be multiplexed precisely. Therefore, a precise wavelength division multiplexed signal may be output.

Figure 24:
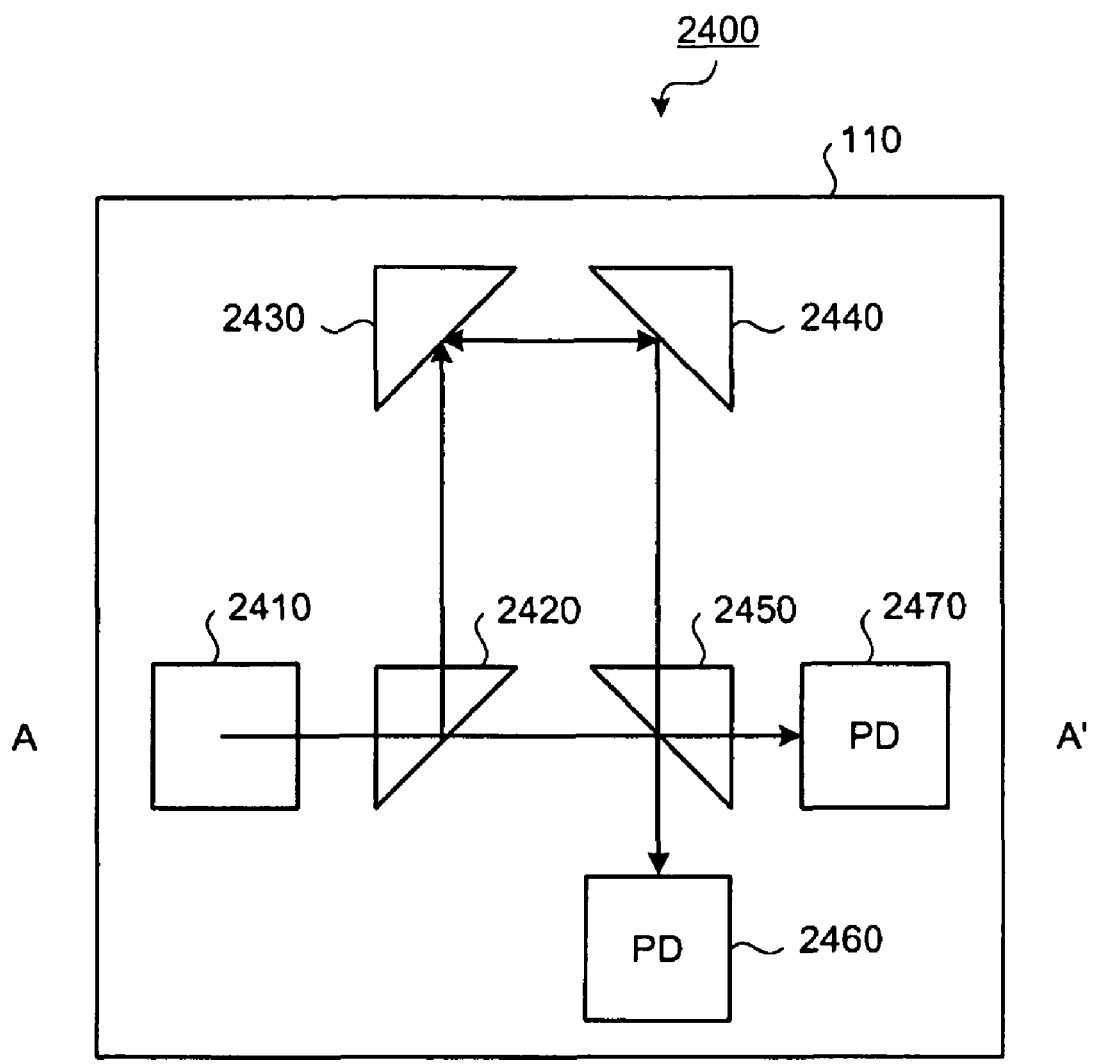
FIG. 24 is a plan view of a receiving circuit according to a fourth example of the embodiments.

FIG. 24 is a plan view of a receiving circuit according to a fourth example of the embodiments. The receiving circuit 2400 according to the fourth example is an example formed by applying the optical subassembly 100 according to the first embodiment to a differential phase shift keying (DPSK) receiving circuit that branches an optical signal applied with DPSK, provides one of the branched signals with a delay of one symbol, and causes the branched signals to interfere therebetween.

As depicted in FIG. 24, the receiving circuit 2400 is a Mach-Zehnder interferometer that includes complete reflection mirrors 2410, 2430, and 2440, half mirrors 2420 and 2450, and PDs 2460 and 2470. Each of the elements included in the receiving circuit 2400 has a configuration formed by modifying the optical subassembly 100, and the wiring substrates 110 of the elements are integrated.

The complete reflection mirror 2410 reflects an optical signal that has been subject to the differential phase shift keying, and reflects the optical signal to the half mirror 2420. The half mirror 2420 reflects a portion of the optical signal from the complete reflection mirror 2410 to the total reflection mirror 2430, and transmits therethrough a portion of the optical signal from the complete reflection mirror 2410 to the half mirror 2450.

The total reflection mirrors 2430 and 2440 configure a detour path that causes the optical signal from the half mirror 2420 to have a delay of one symbol. The complete reflection mirrors 2430 and 2440 induce a delay to the optical signal from the half mirror 2420 and reflect the optical signal to the half mirror 2450.

The half mirror 2450 reflects a portion of the optical signal from the half mirror 2420 to the PD 2460, and transmits therethrough a portion of the optical signal from the half mirror 2420 to the PD 2470. The half mirror 2450 reflects a portion of the optical signal from the complete reflection mirror 2440 to the PD 2470, and transmits therethrough a portion of the optical signal from the total reflection mirror 2440 to the PD 2460.

The PDs 2460 and 2470 receive the optical signals from the half mirror 2450 and convert the optical signals into electrical signals. The optical signals respectively received by the PDs 2460 and 2470 have a positive phase and negative phase relation. The receiving circuit 2400, receiving optical signals having such a positive phase and negative phase relation, performs balance reception and, thereby, demodulates the optical signals that have been subject to the differential phase shift keying.

Figure 25:
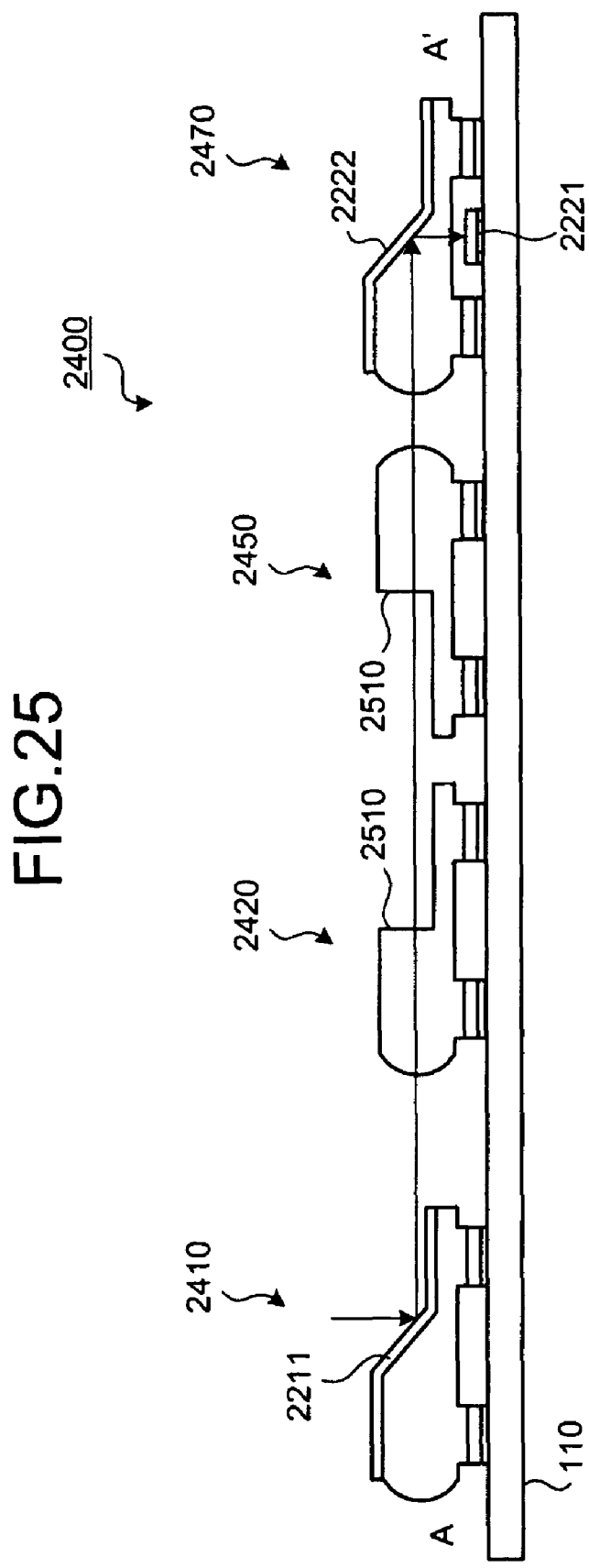
FIG. 25 is a front cross-sectional view of the receiving circuit according to the fourth example of the embodiments.
Figure 26:
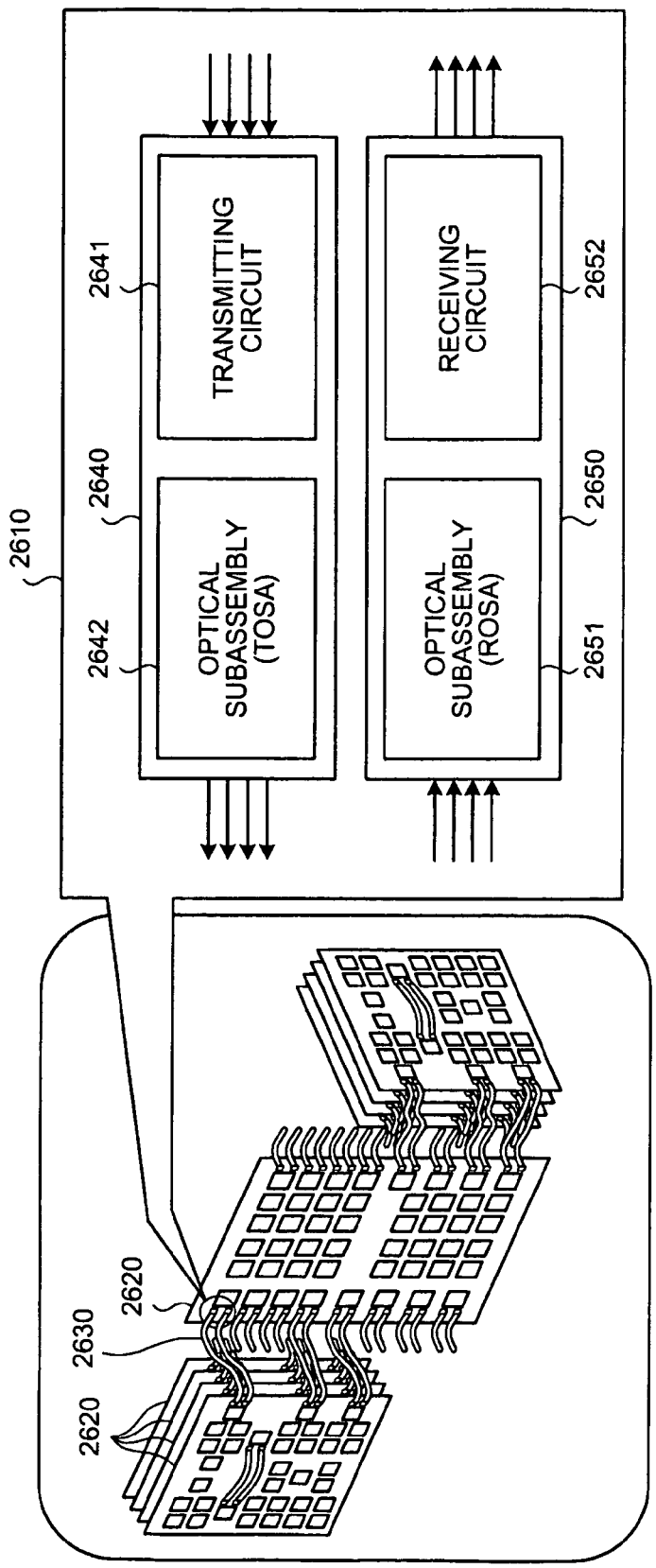
FIG. 26 is a perspective diagram of an optical interconnecting module.
Figure 27:
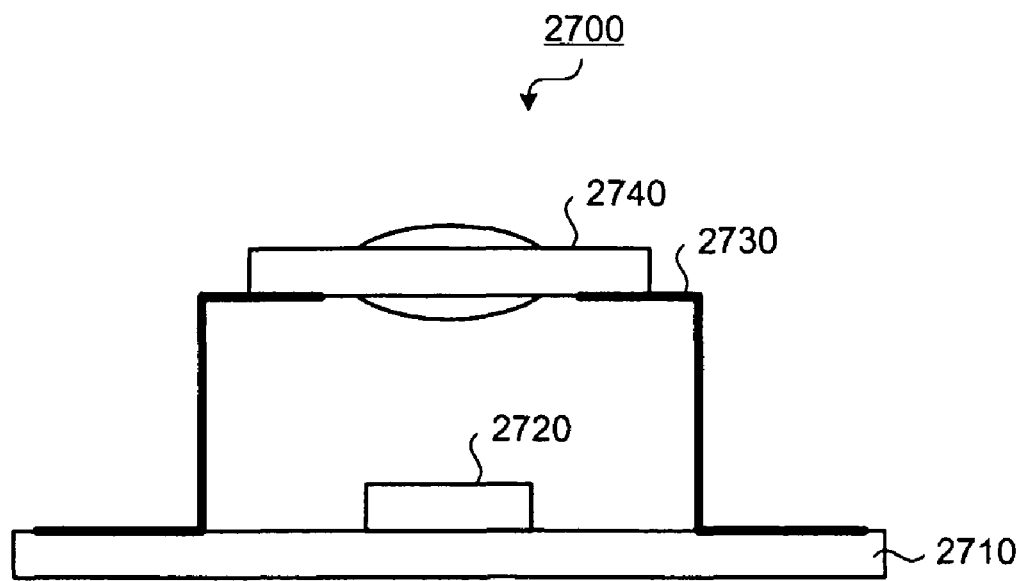
FIG. 27 is a front cross-sectional view of a conventional optical subassembly.
Figure 28:
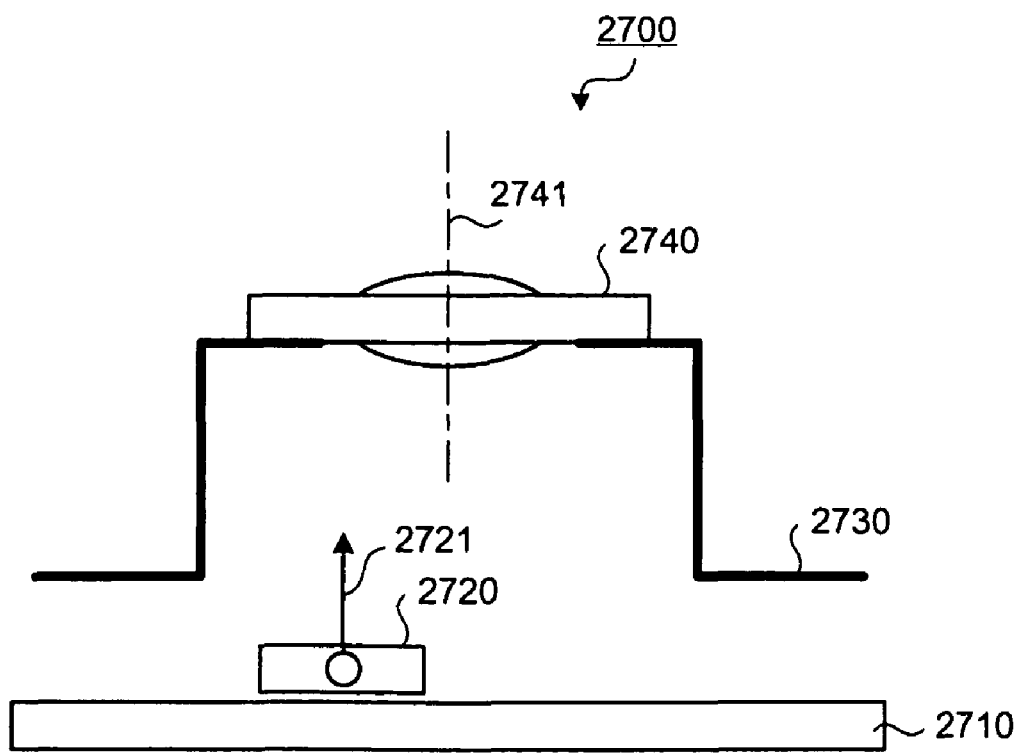
FIG. 28 is a front cross-sectional view of alignment of the optical axes of the conventional optical subassembly.

FIG. 25 is a front cross-sectional view of the receiving circuit according to the fourth example of the embodiments. FIG. 25 is a cross-sectional view taken along AA' of FIG. 24. As depicted in FIG. 25, the complete reflection mirror 2410 has a configuration identical to that of the reflecting member 2350 (see FIG. 23). Though not depicted, the complete reflection mirrors 2430 and 2440 each have a configuration formed by modifying the reflecting mirror 2211 in the above reflecting member 2350 such that a light beam emitted parallel to the wiring substrate 110 is reflected at right angles to remain parallel to the wiring substrate 110.

The half mirrors 2420 and 2450 each have a configuration formed by including the half mirror 2510 instead of the reflecting mirror 2211 and omitting the LD 160 in the above TOSA 2210. Though not depicted, the PD 2460 also has a configuration identical to that of the ROSA 2220.

According to the receiving circuit 2400 of the fourth example, elements that are Mach-Zehnder interferometers are able to be densely mounted by applying a modified configuration of the optical subassembly 100 to the Mach-Zehnder interferometers. Thus, a small-sized Mach-Zehnder interferometer may be configured.

The elements including the complete reflecting mirrors 2410, 2430, and 2440, the half mirrors 2420 and 2450, and the PDs 2460 and 2470 are precisely positioned relative to the wiring substrate 110 and, thus, a precise Mach-Zehnder interferometer is configured. Hence, an optical signal that has been subjected to the differential phase shift keying is able to be accurately demodulated.

In each of the above examples, an example of applying the optical subassembly 100 according to the first embodiment is described. However, the optical subassembly 100 according to the second embodiment may also be applied to each of the above examples.

As described, according to the method of manufacturing the optical subassembly and the optical subassembly according to embodiments, reduction of the cost of the optical subassembly is achieved together with a reduction in the size of the optical subassembly. By applying the method of manufacturing the optical subassembly and the optical subassembly according to the embodiments to an OSA array, an optical interconnecting device, a WDM oscillator, and a receiving circuit, a reduction in the manufacturing time, the device size, and improvement of the precision of the OSA array, the optical interconnecting device, the WDM oscillator, and the receiving circuit is able to be achieved.

According to the above configuration, the lens member may be automatically and precisely positioned relative to the wiring substrate and the high-melting-point glass, at a high speed by using the self-alignment effect induced the surface tension of melted low-melting-point glass. Thereby, the time necessary for manufacturing the optical subassembly is reduced.

According to the above configuration, by respectively forming the protrusion portion of the lens member, the high-melting-point glass, and the low-melting-point glass into a ring shape surrounding the connecting electrodes, the optoelectronic converting element is hermetically sealed by the lens member without the use of a metal cap and thereby, enables a reduction in the size of the optical subassembly.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical subassembly manufacturing method comprising:
    forming connecting electrodes and a convex piece of first glass on a wiring substrate, the position of the convex piece of first glass being determined relative to respective positions of the connecting electrodes;
    positioning on and electrically coupling to the connecting electrodes, an optoelectronic converting element;
    disposing on the piece of first glass, a piece of second glass that has a melting point lower than that of the piece of first glass; and
    fixing to the piece of second glass, a protruding portion of a lens member further having a lens portion, the protruding portion having a shape matching that of the piece of first glass, and relative positions of the protruding portion and the optical axis of the lens portion being determined to correspond to relative positions of the connecting electrodes and the piece of first glass, wherein
    the fixing includes fixing the protruding portion of the lens member to the piece of first glass via surface tension generated by melting the piece of second glass.

2. The optical subassembly manufacturing method according to claim 1, wherein
    the optoelectronic converting element comprises an optoelectronic converter and electrodes electrically coupled to the optoelectronic converter, relative positions of the optical axis of the optoelectronic converter and the electrodes being predetermined positions,
    the disposing includes disposing on the connecting electrodes, a low-melting-point solder bump that has a melting point lower than that of connecting electrodes and fixing to electrodes of the optoelectronic converting element, and
    the fixing includes fixing the optoelectronic converting element relative to the connecting electrodes via the surface tension generated by melting the low-melting-point solder bump.

3. The optical subassembly manufacturing method according to claim 1, wherein
the forming includes forming the piece of first glass in a ring shape surrounding the connecting electrodes,
the protruding portion of the lens member is formed in a ring shape matching that of the piece of first glass,
the fixing includes fixing the optoelectronic converting element to be hermetically sealed by the wiring substrate, the piece of first glass, the piece of second glass, and the lens member.

4. The optical subassembly manufacturing method according to claim 1, wherein
the forming includes forming a plurality of pieces of first glass interspersed on the wiring substrate,
the disposing includes disposing a plurality of pieces of second glass on the pieces of first glass, and
the lens member has a plurality of protruding portions matching the pieces of first glass.

5. The optical subassembly manufacturing method according to claim 4, further comprising:
forming on the wiring substrate, a piece of third glass having a ring shape surrounding the connecting electrodes; and
disposing on the piece of third glass, a piece of fourth glass that has a melting point lower than that of the piece of third glass, wherein
the lens member further has a second protruding portion having a ring shape matching the piece of second third glass, and
the fixing includes, after positioning the lens member, fixing the piece of third glass and the second protruding portion by melting the piece of fourth glass, the optoelectronic converting element becoming hermetically sealed by the wiring substrate, the piece of third glass, the piece of fourth glass, and the lens member.

6. The optical subassembly manufacturing method according to claim 1, wherein
the protruding portion of the lens member is optically transparent transmitting therethrough a laser beam, and
the fixing includes melting the piece second glass via transmission of the laser beam through the protruding portion to the piece of second glass.

7. The optical subassembly manufacturing method according to claim 6, wherein
the forming includes forming the piece of first glass and the piece of second glass into a ring shape surrounding the connecting electrodes,
the protruding portion of the lens member is formed into a ring shape matching the piece of first glass, and
the fixing includes applying the laser beam to the piece of second glass, by moving along the ring shape of the piece of second glass, an apparatus emitting the laser beam.

8. The optical subassembly manufacturing method according to claim 6, wherein
the laser beam is a femtosecond laser beam.

9. The optical subassembly manufacturing method according to claim 1, wherein
the forming includes forming the connecting electrodes and the piece of first glass using lithography.

10. The optical subassembly manufacturing method according to claim 1, wherein
the piece of first glass and the piece of second glass are silica glass, the piece of second glass having a melting point that is lower than that of the piece of first glass as a result of an addition of an impurity to the silica glass.

11. An optical assembly manufacturing method comprising:
forming connecting electrodes and a piece of first glass on a wiring substrate;
positioning on and electrically coupling to the connecting electrodes, an optoelectronic converting element;
disposing on the piece of first glass, a piece of second glass that has a melting point lower than that of the piece of first glass; and
fixing to the piece of second glass, a protruding portion of a lens member having a lens portion, the fixing including fixing the protruding portion of the lens member to the piece of first glass via surface tension generated by melting the piece of second glass.

* * * * *

UNITED STATES PATENT AND TRADEMARK OFFICE
CERTIFICATE OF CORRECTION

PATENT NO. : 8,162,547 B2
APPLICATION NO. : 12/654542
DATED : April 24, 2012
INVENTOR(S) : Hiroyuki Nobuhara et al.

It is certified that error appears in the above-identified patent and that said Letters Patent is hereby corrected as shown below:

Title page Col. 2 (Other Publications), Lines 2-6, After "2007." delete "Japanese PCT International Preliminary Report on Patentability mailed Jan. 14, 2010 in corresponding International Patent Application PCT/JP2007/063016 (6 pages) including English translation of the International Preliminary Report mailed Feb. 4, 2010 (7 pages)." and insert the same on First Page, Col. 2, under Other Publications, Line 3, as a new entry.

Column 19, Line 39, In Claim 6, delete "piece second" and insert -- piece of second --, therefor.

Signed and Sealed this
Third Day of July, 2012

David J. Kappos
*Director of the United States Patent and Trademark Office*